(12) United States Patent
Oh et al.

(10) Patent No.: US 10,998,268 B2
(45) Date of Patent: May 4, 2021

(54) SEMICONDUCTOR DEVICE

(71) Applicant: SK hynix Inc., Gyeonggi-do (KR)

(72) Inventors: Sung-Lae Oh, Chungcheongbuk-do (KR); Kwang-Hwi Park, Gyeonggi-do (KR); Tae-Sung Park, Gyeonggi-do (KR); Chang-Man Son, Gyeonggi-do (KR); Jung-Hoon Lee, Gyeonggi-do (KR); Soo-Nam Jung, Seoul (KR); Ji-Eun Joo, Seoul (KR); Ji-Hyun Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 50 days.

(21) Appl. No.: 16/590,024

(22) Filed: Oct. 1, 2019

(65) Prior Publication Data
US 2020/0227352 A1 Jul. 16, 2020

(30) Foreign Application Priority Data

Jan. 16, 2019 (KR) .................... 10-2019-0005564

(51) Int. Cl.
*H01L 23/528* (2006.01)
*G11C 5/06* (2006.01)
(Continued)

(52) U.S. Cl.
CPC ........... *H01L 23/5286* (2013.01); *G11C 5/06* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
CPC ....................... H01L 23/5286; H01L 27/11519
See application file for complete search history.

(56) References Cited

U.S. PATENT DOCUMENTS 5,285,018 A * 2/1994 Pence, IV ............... H01L 23/50
174/255
6,255,600 B1 * 7/2001 Schaper .............. H01L 23/5383
174/255
(Continued)

FOREIGN PATENT DOCUMENTS

KR 1991-0008836 5/1991
KR 10-2007-0115747 12/2007

*Primary Examiner* — Douglas M Menz
(74) *Attorney, Agent, or Firm* — IP & T Group LLP

(57) ABSTRACT

A semiconductor device includes an internal circuit and a power mesh configured to transmit an operating voltage to the internal circuit. The power mesh includes first power lines extending in a first direction and arranged in a second direction intersecting with the first direction, when viewed from a top; second power lines sharing lanes with the first power lines and at least partially overlapping with the first power lines in the second direction; first power straps extending in the second direction and coupled to the first power lines; and second power straps extending in the second direction and coupled to the second power lines. Each of the first and second power lines may have a width of the same size as a width of each lane in sections where they do not overlap, and may have a width of a size smaller than the width of each lane in sections where they overlap.

20 Claims, 20 Drawing Sheets

(51) Int. Cl.
*H01L 27/11529* (2017.01)
*H01L 27/11519* (2017.01)
*H01L 27/1157* (2017.01)
*H01L 27/11524* (2017.01)
*H01L 27/11565* (2017.01)
*H01L 27/11573* (2017.01)
*H01L 27/11582* (2017.01)
*H01L 27/11556* (2017.01)

(56) References Cited

U.S. PATENT DOCUMENTS

| | | | |
|---|---|---|---|
| 8,927,879 B2* | 1/2015 | Choi | G06F 30/398 |
| | | | 174/262 |
| 2009/0193271 A1* | 7/2009 | Chuang | H01L 23/5286 |
| | | | 713/300 |
| 2014/0210100 A1* | 7/2014 | Xiao | H01L 23/481 |
| | | | 257/774 |
| 2014/0347908 A1* | 11/2014 | Liaw | H01L 27/1104 |
| | | | 365/72 |
| 2016/0321992 A1* | 11/2016 | Kim | G09G 3/3225 |
| 2017/0194331 A1* | 7/2017 | Liaw | H01L 27/0924 |
| 2018/0166386 A1* | 6/2018 | Biswas | H01L 23/528 |
| 2018/0211914 A1* | 7/2018 | Frederick, Jr. | G06F 30/394 |
| 2019/0355749 A1* | 11/2019 | Do | G06F 30/39 |

* cited by examiner

SEMICONDUCTOR DEVICE

CROSS-REFERENCE TO RELATED APPLICATION

The present application claims priority under 35 U.S.C. § 119 (a) to Korean Patent Application No. 10-2019-0005564 filed in the Korean Intellectual Property Office on Jan. 16, 2019, which is incorporated herein by reference in its entirety.

BACKGROUND

1. Technical Field

Various embodiments of the present invention generally relate to a semiconductor device, and more particularly, to a power mesh structure of a semiconductor device.

2. Related Art

In general, an internal circuit of a semiconductor device may use a voltage generated using a relatively higher, externally supplied voltage as the operating voltage. Typically, a semiconductor device transfers an operating voltage to an internal circuit through a power mesh.

Typically, the operating voltage is reduced due to the resistance of the power mesh as it is transferred through the power mesh. If the reduction is substantial, the internal circuit may operate unstably or cause a malfunction. Therefore, the resistance of the power mesh may be an important factor for the performance characteristics of the semiconductor device, and is generally desirable to reduce the resistance of the power mesh in order to improve the performance of the semiconductor device.

SUMMARY

In an embodiment, a semiconductor device may include: an internal circuit and a power mesh configured to transmit an operating voltage to the internal circuit. The power mesh may include a plurality of first power lines extending in a first direction and arranged in a second direction intersecting with the first direction, when viewed from a top; a plurality of second power lines sharing lanes with the first power lines and at least partially overlapping with the first power lines in the second direction; a plurality of first power straps extending in the second direction and coupled to the first power lines; and a plurality of second power straps extending in the second direction and coupled to the second power lines. Each of the first power lines and the second power lines may have a width of the same size as a width of each lane in sections where they do not overlap with each other, and may have a width of a size smaller than the width of each lane in sections where they overlap with each other.

In an embodiment, a semiconductor device may include: an internal circuit, a power mesh configured to transmit an operating voltage to the internal circuit, and a signal line configured to provide a signal routing to the internal circuit. The power mesh may include a plurality of power lines extending in a first direction and arranged in a second direction intersecting with the first direction, when viewed from a top; and a plurality of power straps extending in the second direction and coupled to the power lines. The signal line may share a lane with at least one of the power lines and the power straps. Each of the power lines and the power straps may have a width of the same size as a width of the lane in sections where they do not overlap with the signal line, and may have a width of a size smaller than the width of the lane in sections where they overlap with the signal line.

In an embodiment, a semiconductor device may include: a memory structure including a plurality of memory cells and a logic structure. The logic structure may include a substrate, logic circuits which are disposed over the substrate and control operations of the memory cells, and a plurality of metal layers including a power mesh which is disposed over the logic circuits and transmits operating voltages to the logic circuits. The substrate may include first to fourth regions which are defined in a first direction. The logic circuits may include first logic circuits which are disposed over the first and third regions and second logic circuits which are disposed over the second and fourth regions. The power mesh may include a plurality of first power lines extending in the first direction and arranged in a second direction intersecting with the first direction, when viewed from a top, and configured to transmit a first operating voltage to the first logic circuits; a plurality of second power lines sharing lanes with the first power lines, and configured to transmit a second operating voltage to the second logic circuits; a plurality of first power straps extending in the second direction and coupled to the first power lines; and a plurality of second power straps extending in the second direction and coupled to the second power lines. The first power lines may be continuous from the first region to the third region and have a reduced width in the second and third regions, and the second power lines may be continuous from the second region to the fourth region and have a reduced width in the second and third regions.

In an embodiment, A semiconductor device comprising a power mesh for transmitting power and or signals to an internal circuit, the power mesh comprising: first and third power lines each extending in a first direction and arranged in an alternating manner at a regular interval along a second direction, the first power lines being shorter than the third power lines; and second power lines extending in the first direction the second power lines forming a plurality of colinear pairs with the first power lines, each pair having a first and a second power line, the first power line having a first power line overlapping area and the second power line having a second power line overlapping area which overlap in the second direction.

A width of each of the overlapping areas of the first and second power lines is one half of the width of the non-overlapping areas.

The third power lines have a uniform width along their length which is the same as the width of the non-overlapping areas of the first and second power lines.

The power mesh further comprises a plurality of first power straps extending in the second direction, the first power straps being coupled with the first power lines; and a plurality of second power straps extending in the second direction, the second power straps being coupled to the second power lines.

DETAILED DESCRIPTION

Figure 1:
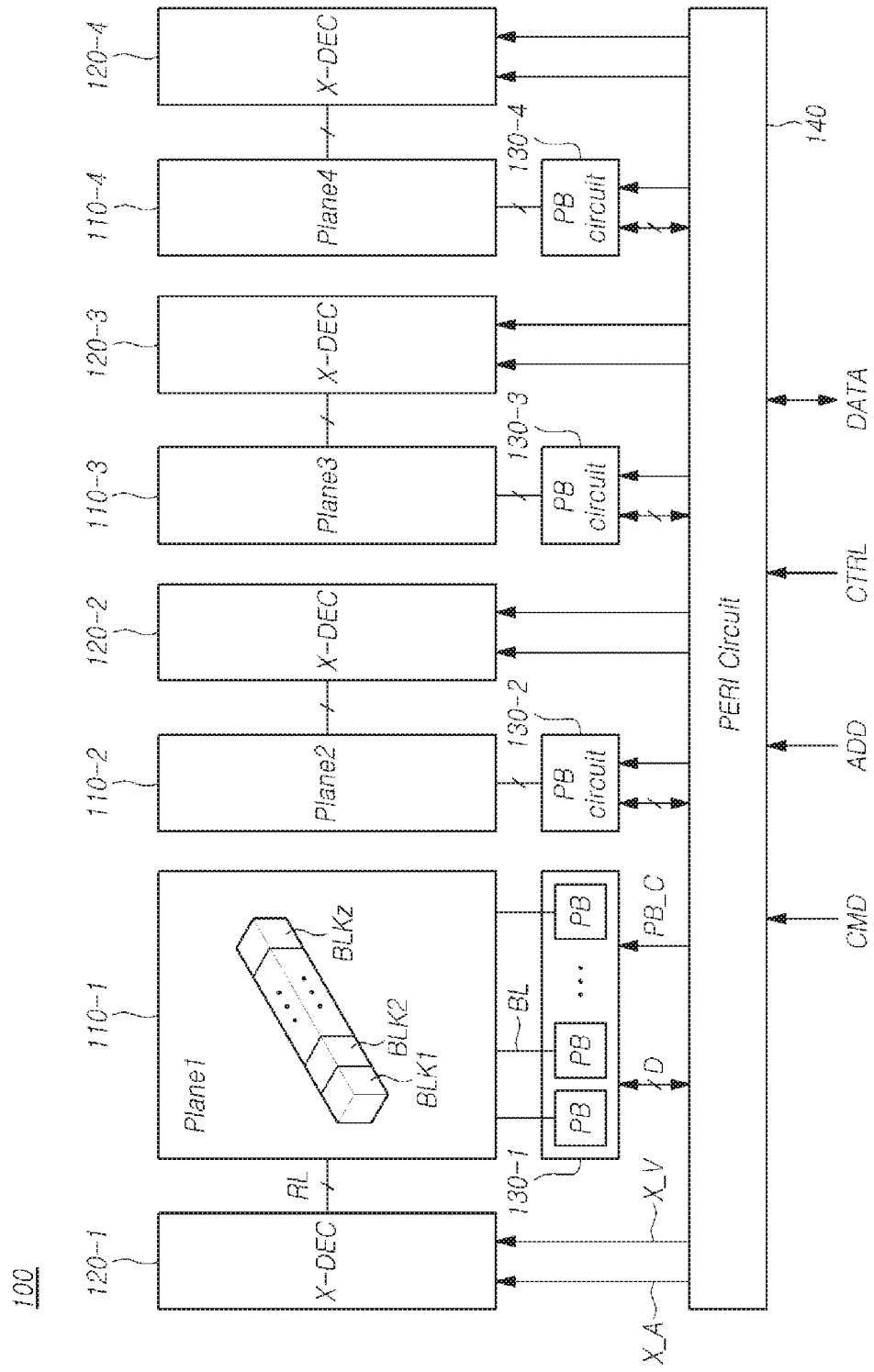
FIG. 1 is a block diagram illustrating a schematic representation of an example of a semiconductor device in accordance with an embodiment of the invention disclosure.

Advantages and features of the invention and methods to achieve them will become apparent from the descriptions of exemplary embodiments herein below with reference to the accompanying drawings. However, the invention is not limited to the exemplary embodiments disclosed herein but may be implemented in various different ways. The exemplary embodiments are provided for making the disclosure of the invention thorough and for fully conveying the scope of the invention to those skilled in the art to which the disclosure pertains. It is to be noted that the scope of the invention is defined only by the claims.

The figures, dimensions, ratios, angles, numbers of elements given in the drawings to describe embodiments of the invention disclosure of the invention are merely illustrative and are not limiting. Throughout the specification, like reference numerals refer to like elements. In describing the disclosure, when it is determined that the detailed description of the known related art may obscure the gist of the invention disclosure, the detailed description thereof will be omitted. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this may include a plural of that noun unless specifically stated otherwise.

In interpreting elements in the described embodiments of the invention disclosure, they should be interpreted as including error margins even without explicit statements.

Also, in describing the components of the invention disclosure, there may be terms used like first, second, A, B, (a), and (b). These are solely for the purpose of differentiating one component from the other but not to imply or suggest the substances, order, sequence or number of the components. If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Also, elements in embodiments of the invention disclosure are not limited by these terms. These terms are used to merely distinguish one element from another. Accordingly, as used herein, a first element may be a second element within the technical idea of the invention.

Features of various exemplary embodiments of the invention may be coupled, combined or separated partially or totally. Technically various interactions and operations are possible. Various exemplary embodiments can be practiced individually or in combination.

Hereinafter, a semiconductor device will be described below with reference to the accompanying drawings through various examples of embodiments.

FIG. 1 is a block diagram illustrating a schematic representation of an example of a semiconductor device in accordance with an embodiment of the invention disclosure.

Referring to FIG. 1, a semiconductor device 100 in accordance with an embodiment of the invention disclosure may include a plurality of planes 110-1 to 110-4 and logic circuits.

Each of the planes 110-1 to 110-4 may include a plurality of memory cells which have states corresponding to data stored therein. Each memory cell may be accessed by a word line and a bit line. Each memory cell may be a volatile memory cell which loses data stored therein in the case where power supply is interrupted, or may be a nonvolatile memory cell which retains data stored therein even though power supply is interrupted. While it is described below that the semiconductor device 100 is a vertical NAND flash device, it is to be understood that the technical idea of the invention disclosure is not limited thereto.

Each of the planes 110-1 to 110-4 may include a plurality of memory blocks BLK1 to BLKz. Each memory block may correspond to an erase unit. Each memory block may include a plurality of cell strings. Each cell string may include at least one drain select transistor, a plurality of memory cells and at least one source select transistor which are coupled in series.

The planes 110-1 to 110-4 may be coupled to corresponding row decoders 120-1 to 120-4, respectively, through row lines RL. Row lines RL may be provided to each memory block. The row lines RL may include one or more drain select lines, a plurality of word lines and one or more source select lines.

The planes 110-1 to 110-4 may be coupled to corresponding page buffer circuits 130-1 to 130-4, respectively, through corresponding bit lines BL. The planes 110-1 to 110-4 may be controlled in their operations (for example, program operations and read operations) independently of one another through their individualized page buffer circuits 130-1 to 130-4. By being controlled independently of one another in this way, the planes 110-1 to 110-4 may perform specific operations in parallel or individually.

While it is illustrated in the embodiment described with reference to the drawing that the semiconductor device 100 includes four planes, it is to be noted that the number of planes is not limited thereto. One or more planes may be provided.

The logic circuits may control the operation of the memory cells included in the planes 110-1 to 110-4 and may include the row decoders 120-1 to 120-4, the page buffer circuits 130-1 to 130-4 and a peripheral circuit 140. The peripheral circuit 140 may refer to components included in the logic circuits, except for the row decoders 120-1 to 120-4 and the page buffer circuits 130-1 to 130-4.

Each of the row decoders 120-1 to 120-4 may select any one among the memory blocks BLK1 to BLKz included in a corresponding plane, in response to a row address X_A provided from the peripheral circuit 140. Each of the row decoders 120-1 to 120-4 may transfer an operating voltage X_V provided from the peripheral circuit 140, to row lines RL which are coupled to a selected memory block.

Each of the page buffer circuits 130-1 to 130-4 may include a plurality of page buffers PB which are coupled to bit lines BL, respectively. Each of the page buffer circuits 130-1 to 130-4 may receive a page buffer control signal PB_C from the peripheral circuit 140, and may transmit and receive a data signal D to and from the peripheral circuit 140. Each of the page buffer circuits 130-1 to 130-4 may control bit lines BL which are arranged in a corresponding plane, in response to the page buffer control signal PB_C. For example, each of the page buffer circuits 130-1 to 130-4 may detect data stored in the memory cells of a corresponding plane by sensing the signals of the bit lines BL of the corresponding plane in response to the page buffer control signal PB_C, and may transmit the data signal D to the peripheral circuit 140 depending on the detected data. Each of the page buffer circuits 130-1 to 130-4 may apply signals to bit lines BL based on the data signal D received from the peripheral circuit 140 in response to the page buffer control signal PB_C, and thereby, may write data in the memory cells of the corresponding plane. Each of the page buffer circuits 130-1 to 130-4 may write data in or read data from the memory cells coupled to a word line which is activated by each of the row decoders 120-1 to 120-4.

The peripheral circuit 140 may receive a command signal CMD, an address signal ADD and a control signal CTRL from another device external to the semiconductor device 100, and may transmit and receive data to and from the external device, for example, a memory controller. The peripheral circuit 140 may output signals for writing data in the planes 110-1 to 110-4 or reading data from the planes 110-1 to 110-4, for example, the row address X_A, the page buffer control signal PB_C and so forth, based on the command signal CMD, the address signal ADD and the control signal CTRL. The peripheral circuit 140 may generate various voltages including the operating voltage X_V, which are required in the semiconductor device 100.

Hereinbelow, in the accompanying drawings, two directions that are parallel to the top surface of a substrate and intersect with each other are defined as a first direction FD and a second direction SD, respectively, and a direction that is perpendicular to the top surface of the substrate is defined as a third direction TD. The first direction FD may correspond to the extending direction of bit lines BL or the arrangement direction of row lines RL, and the second direction SD may correspond to the extending direction of the row lines RL or the arrangement direction of the bit lines BL. In an embodiment, the first direction FD and the second direction SD may intersect perpendicularly or substantially perpendicularly with each other, and the third direction TD may correspond to a direction that is perpendicular to a plane extending in the first direction FD and the second direction SD. In the following descriptions, the third direction TD may also be referred to as a 'vertical' or 'vertical direction.' In the drawings, a direction indicated by an arrow and a direction opposite thereto represent the same direction.

Figure 2:
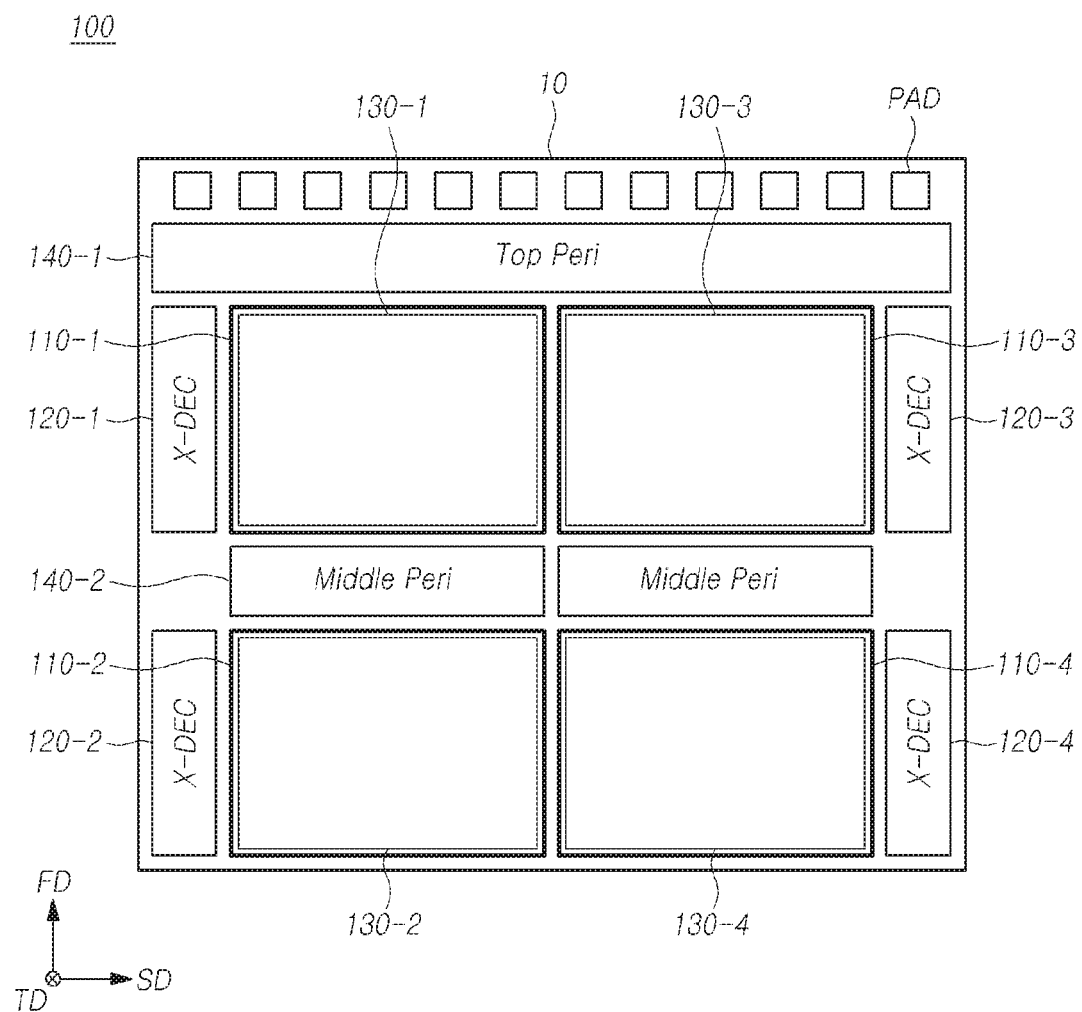
FIG. 2 is a top view schematically illustrating a representation of an example of the semiconductor device in accordance with an embodiment of the invention disclosure.
Figure 3:
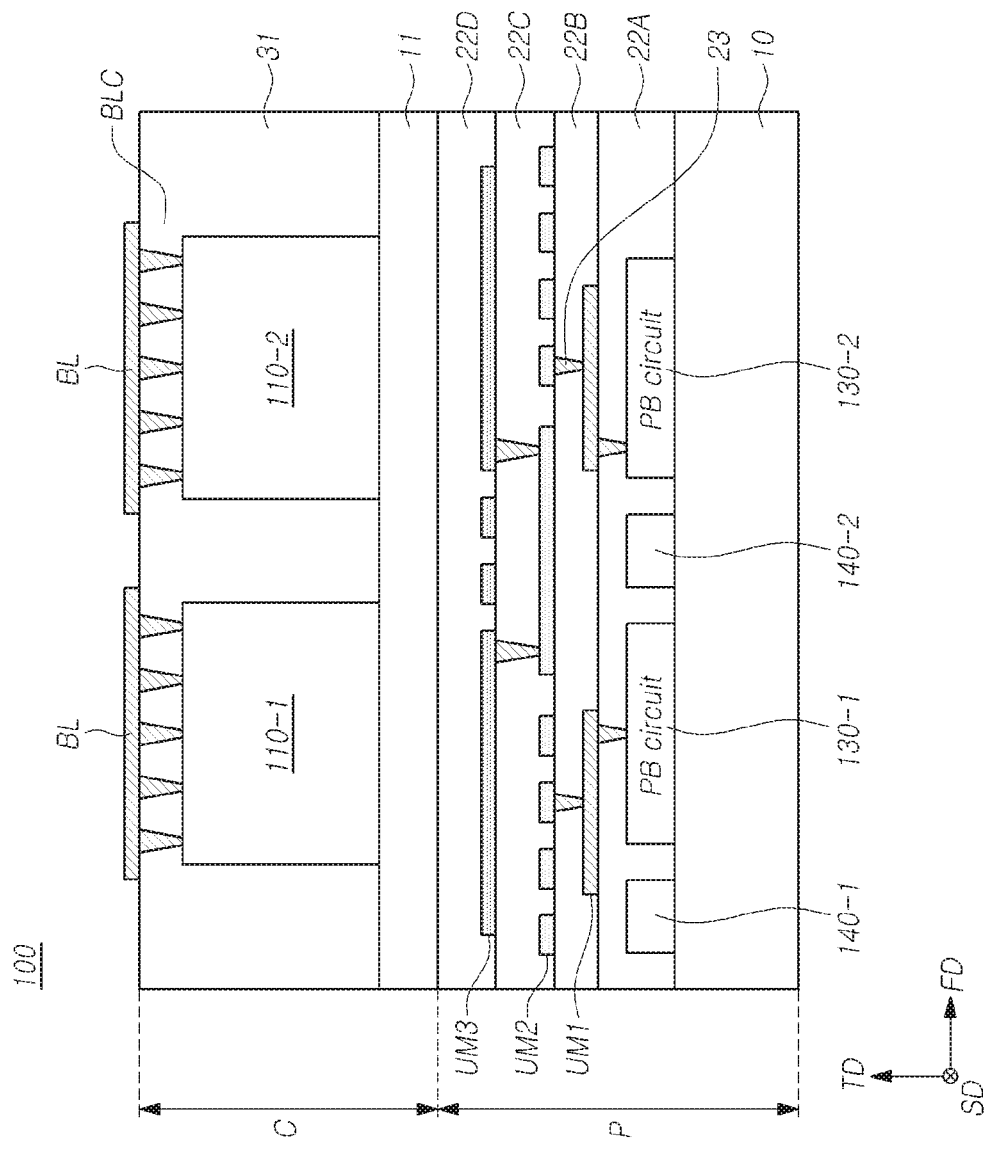
FIG. 3 is a cross-sectional view schematically illustrating a representation of an example of the semiconductor device in accordance with an embodiment of the invention disclosure.

FIG. 2 is a top view schematically illustrating a representation of an example of the semiconductor device 100 in accordance with an embodiment of the invention disclosure, and FIG. 3 is a cross-sectional view schematically illustrating a representation of an example of the semiconductor device 100 in accordance with an embodiment of the invention disclosure.

Referring now to FIG. 2, the semiconductor device 100 may have a PUC (peri under cell) structure. Referring to FIGS. 2 and 3, a logic structure P including the logic circuits may be disposed under a memory structure C. The memory structure C may include a plurality of memory cells.

Although the embodiment described with reference to the drawings shows a case where the semiconductor device 100 has a PUC structure, it is to be noted that the disclosure is not limited thereto. For example, in an embodiment, the logic structure P and the memory structure C may be disposed in a planar manner on a single substrate without overlapping in the third direction TD.

The logic structure P may include a substrate 10, and the memory structure C may include a source plate 11.

Figure 18:
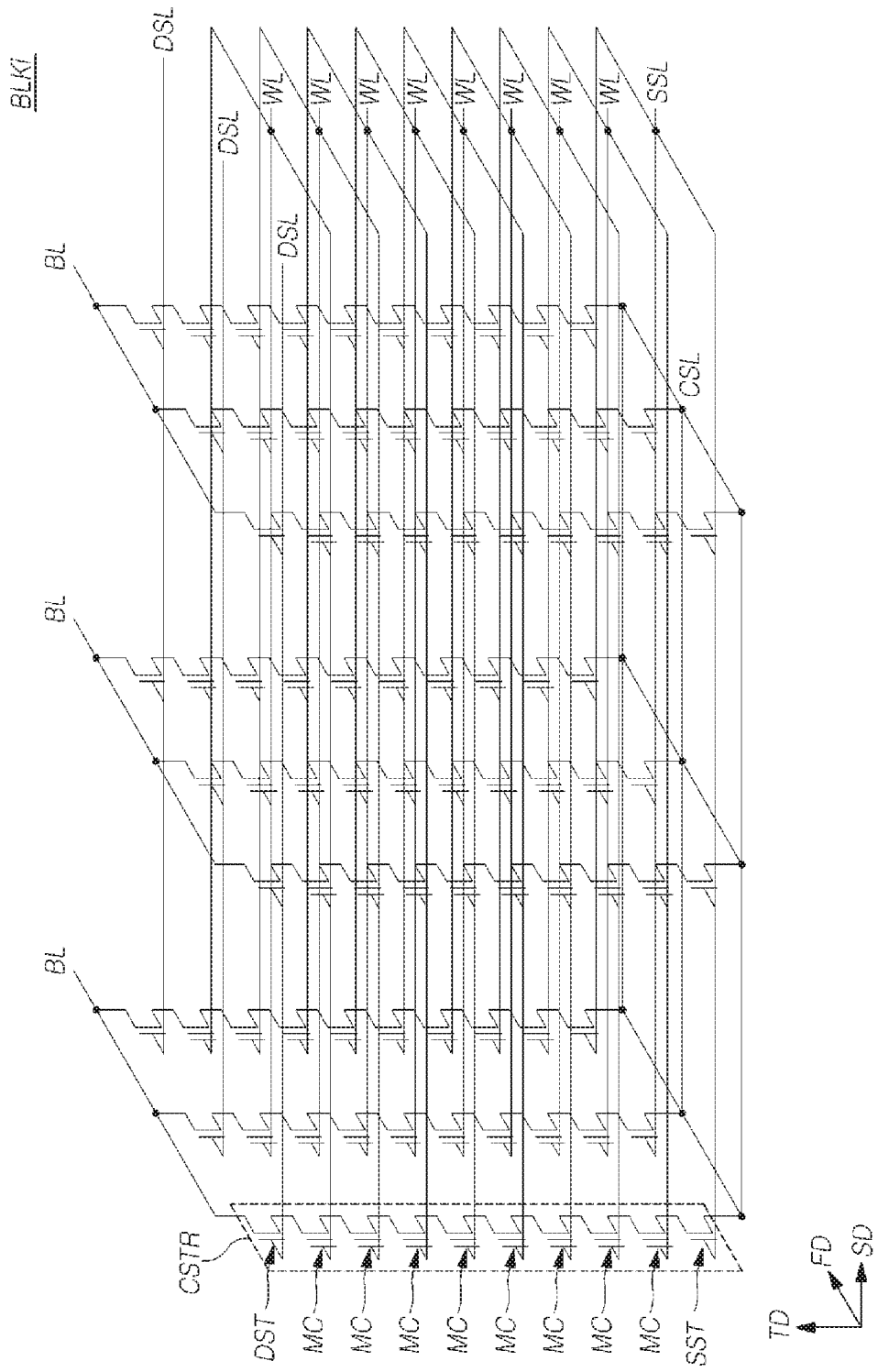
FIG. 18 is a circuit diagram illustrating a schematic representation of an example of a portion of the memory cell array illustrated in FIG. 1.

The memory structure C may include the plurality of planes 110-1 to 110-4 which are disposed on the source plate 11. When viewed from the top, the planes 110-1 to 110-4 may be arranged in a 2×2 matrix extending in the first and the second directions FD, SD. While not illustrated, each of the planes 110-1 to 110-4 may include a plurality of electrode layers and a plurality of interlayer dielectric layers which are alternately stacked, and a plurality of vertical channels (semiconductor pillars) which pass through the electrode layers and the interlayer dielectric layers. The vertical channels may be electrically coupled to source regions which are defined in the source plate 11. The electrode layers may be coupled with the vertical channels and thereby configure memory cells which are arranged three-dimensionally. An example of this structure is shown in FIG. 18.

A top dielectric layer 31 may be formed on the source plate 11 and cover the planes 110-1 to 110-4. The top dielectric layer 31 may include a silicon oxide, for example, an HDP (high density plasma) oxide layer or a TECHS (tetra-ethyl-ortho-silicate) oxide layer.

Bit lines BL may be disposed on the top dielectric layer 31. The bit lines BL may extend in the first direction FD, and may be electrically coupled to the vertical channels of the planes 110-1 to 110-4 through bit line contacts BLC.

The logic structure P may include the logic circuits, bottom dielectric layers 22A to 22D and bottom metal layers UM1 to UM3. The logic circuits may include the row decoders 120-1 to 120-4, the page buffer circuits 130-1 to 130-4 and peripheral circuits 140-1 and 140-2 which are disposed on the substrate 10.

When viewed from the top, each of the row decoders 120-1 to 120-4 may be disposed adjacent to a corresponding plane in the second direction SD. Each of the row decoders 120-1 to 120-4 may be disposed to have an elongated shape which extends in the first direction FD. The first direction may be the arrangement direction of the row lines RL. The length of each of the row decoders 120-1 to 120-4 in the first direction FD may be the same or substantially the same as the length of a corresponding plane in the first direction FD.

The page buffer circuits 130-1 to 130-4 may be disposed to overlap with the planes 110-1 to 110-4 in the third direction TD. The page buffer circuits 130-1 to 130-4 may be disposed to partially or completely overlap with the planes 110-1 to 110-4 in the third direction TD. In the embodiment of FIG. 3, page buffer circuits 130-1 AND 130-2 are arranged to completely overlap in the third direction TD with their respective corresponding planes 110-1 and 110-2. Although not shown, the length of each of the page buffer circuits 130-1 to 130-4 in the second direction SD may be the same or substantially the same as the length of a corresponding plane in the second direction SD.

A plurality of input/output pads PAD serving as the external contacts of the semiconductor device 100 for electrical coupling with an external device may be disposed in the second direction SD at a periphery of the substrate 10. For example, FIG. 2 shows 12 pads spaced apart at a regular interval along an edge of the semiconductor device 100 extending along the second direction SD.

The peripheral circuit 140 may include first and second peripheral circuits 140-1, 140-2. The first peripheral circuit 140-1 may be disposed to the periphery of the substrate 10 where the input/output pads PAD are positioned. The second peripheral circuit 140-2 may be disposed at a central portion of the substrate 10 between adjacent planes arranged in the first direction FD. The first peripheral circuit 140-1 may also be referred to herein as a top peripheral circuit (top peri) and the second peripheral circuit 140-2 may be referred to as a middle peripheral circuit (middle peri).

The first peripheral circuit 140-1 may be disposed adjacent to the input/output pads PAD, and more specifically between the row of the input/output pads PAD and the planes 110-1 and 110-3. The second peripheral circuit 140-2 may be disposed between the page buffer circuits 130-1 to 130-4 which neighbor in the first direction FD.

The bottom dielectric layers 22A to 22D may include first to fourth bottom dielectric layers which are sequentially stacked on the substrate 10. The first to fourth bottom dielectric layers 22A to 22D may include a silicon oxide, for example, an HDP oxide layer or a TEOS oxide layer. The source plate 11 may be disposed on the uppermost layer among the bottom dielectric layers 22A to 22D, for example, the fourth bottom dielectric layer 22D. The first bottom dielectric layer 22A may be formed on the substrate 10 and cover the row decoders 120-1 to 120-4, the page buffer circuits 130-1 to 130-4 and the peripheral circuits 140-1 and 140-2.

The bottom metal layers UM1 to UM3 may be disposed on the first to third bottom dielectric layers 22A, 22B and 22C, respectively. The bottom metal layers UM1 to UM3 may include a first bottom metal layer UM1 formed on the first bottom dielectric layer 22A, a second bottom metal layer UM2 formed on the second bottom dielectric layer 22B, and a third bottom metal layer UM3 formed on the third bottom dielectric layer 22C. Bottom metal layers UM1 to UM3 at different layers may be coupled with one another and/or with the page buffer circuits 130-1, 130-2 through vertical vias 23 forming suitable electrical paths according to design.

While FIG. 3 illustrates a case including three bottom metal layers UM1 to UM3, it is to be noted that the disclosure is not limited thereto. For example, the semiconductor device 100 may include two or at least four bottom metal layers. The term 'bottom' refers to the relative position of a metal layer with respect to the memory structure C. A bottom metal layer should be understood as a conductive component which is included in a respective bottom dielectric layer 22B to 22D. The bottom metal layers may preferably include a conductive material such as a metal, or a metal containing material.

A power mesh PM (see FIG. 4) may be formed in the second and third bottom metal layers UM2 and UM3, and thereby, may transmit operating voltages to the page buffer circuits 130-1 to 130-4 and the peripheral circuits 140-1 and 140-2. The plurality of signal lines may be disposed in the bottom metal layers UM1 to UM3. The signal lines may be used for transmission of various signals required for the operation of the page buffer circuits 130-1 to 130-4 and the peripheral circuits 140-1 and 140-2. The signals may include, for example, command signals, address signals, control signals, data, and the like. The signal lines are disposed in the first bottom metal layer UM1 among the bottom metal layers UM1 to UM3 the most. The power mesh may not be disposed in the first bottom metal layer UM1 to avoid the signal lines. Operating voltages to be used in the peripheral circuits 140-1 and 140-2 and operating voltages to be used in the page buffer circuits 130-1 to 130-4 may be different from each other. For example, the peripheral circuits 140-1 and 140-2 may use a power supply voltage Vcc and a ground voltage Vss as operating voltages, and the page buffer circuits 130-1 to 130-4 may use a core voltage Vcore and the ground voltage Vss as operating voltages.

While not illustrated, the logic circuits may include an LDO (low-drop output) regulator. The LDO regulator may generate the power supply voltage Vcc and the core voltage Vcore from an externally supplied voltage through at least one of the input/output pads PAD. The power supply voltage Vcc generated from the LDO regulator may be transmitted to the peripheral circuits 140-1 and 140-2 through a Vcc power mesh. Also, the core voltage Vcore generated from the LDO regulator may be transmitted to the page buffer circuits 130-1 to 130-4 through a Vcore power mesh. The externally supplied ground voltage Vss through the at least one of the input/output pads PAD may be transmitted to the peripheral circuits 140-1 and 140-2 and the page buffer circuits 130-1 to 130-4 through a Vss power mesh.

While not illustrated, signal lines may be formed in the bottom metal layers UM1 to UM3, thereby configuring signal routings.

The bottom metal layers UM1 to UM3 may be configured to have properties that may not exhibit a process failure, for example, a hillock, at a maximum temperature (hereinafter, referred to as a 'process critical temperature') in a process for forming the memory structure C or the bit lines BL. In other words, the bottom metal layers UM1 to UM3 may be formed of a conductive material which has an effective heat resistance characteristic at the process critical temperature. For example, the bottom metal layers UM1 to UM3 may include a material which has a melting point higher than the process critical temperature. For example, the bottom metal layers UM1 to UM3 may be made of tungsten (W), or tungsten containing material. On the other hand, a conductive material for the bit lines BL may include a material which has a resistivity lower than the conductive material configuring the bottom metal layers UM1 to UM3. For example, a conductive material for the bit lines BL may include a material such as copper or aluminum, which has a low resistivity although it may cause a process failure at a temperature lower than the process critical temperature. Because the bit lines BL are formed after forming the memory structure C, a material which has a low melting point and a low resistivity may be used as a conductive material which configures the bit lines BL. Due to the above-described limitation in a manufacturing process, the resistivity of the bottom metal layers UM1 to UM3 may have a value relatively larger than the bit lines BL. Due to this fact, as the resistance of the power mesh (see the reference symbol PM of FIG. 4) which is defined in the second and third bottom metal layers UM2 and UM3 increases, the electrical characteristics of the semiconductor device 100 may deteriorate. The present invention disclosure provides a method of reducing the resistance of the power mesh PM and thereby improving the electrical characteristics of the semiconductor device 100.

Figure 4:
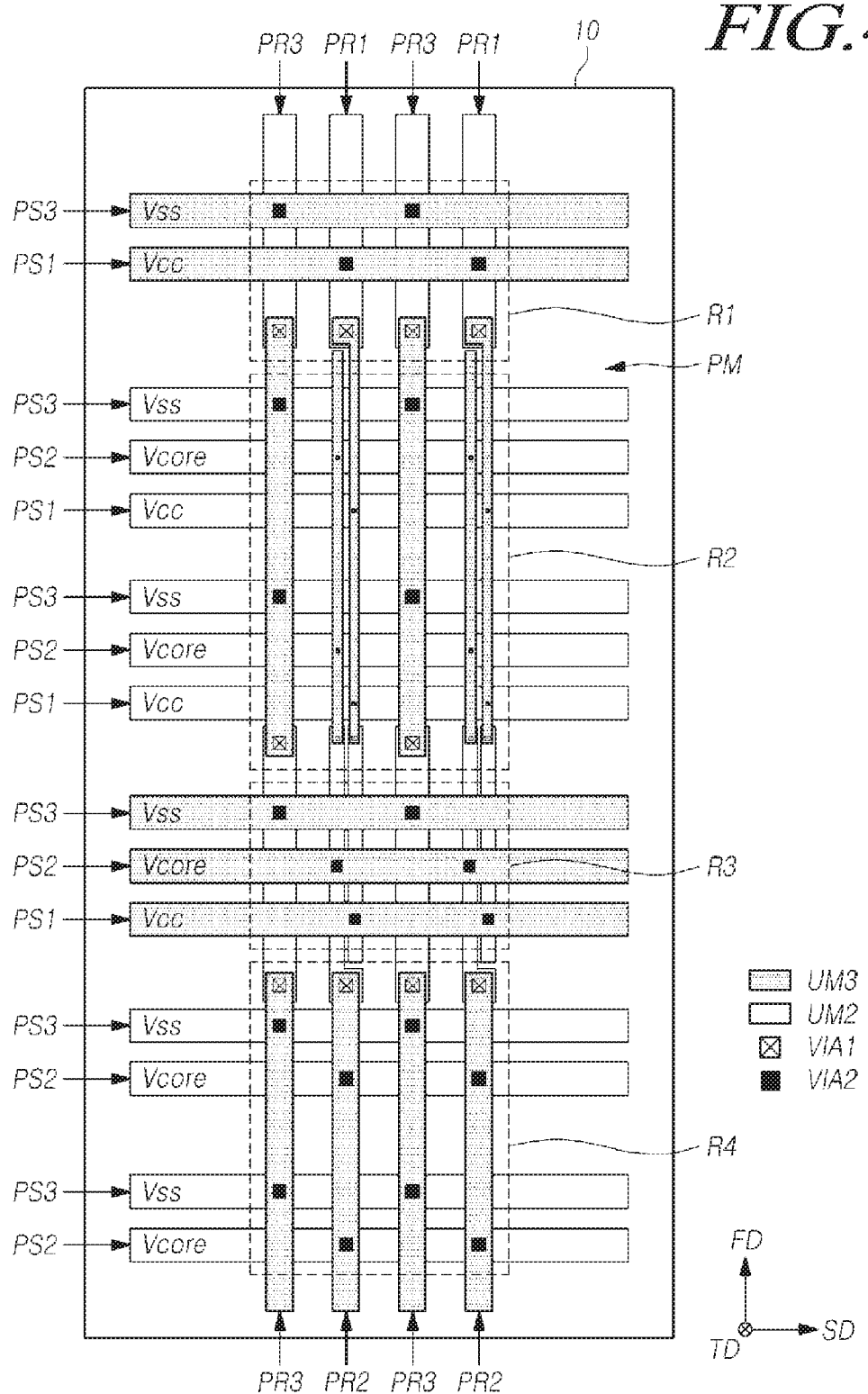
FIG. 4 is a top view schematically illustrating a representation of an example of a power mesh of the semiconductor device in accordance with an embodiment of the invention disclosure.
Figure 5:
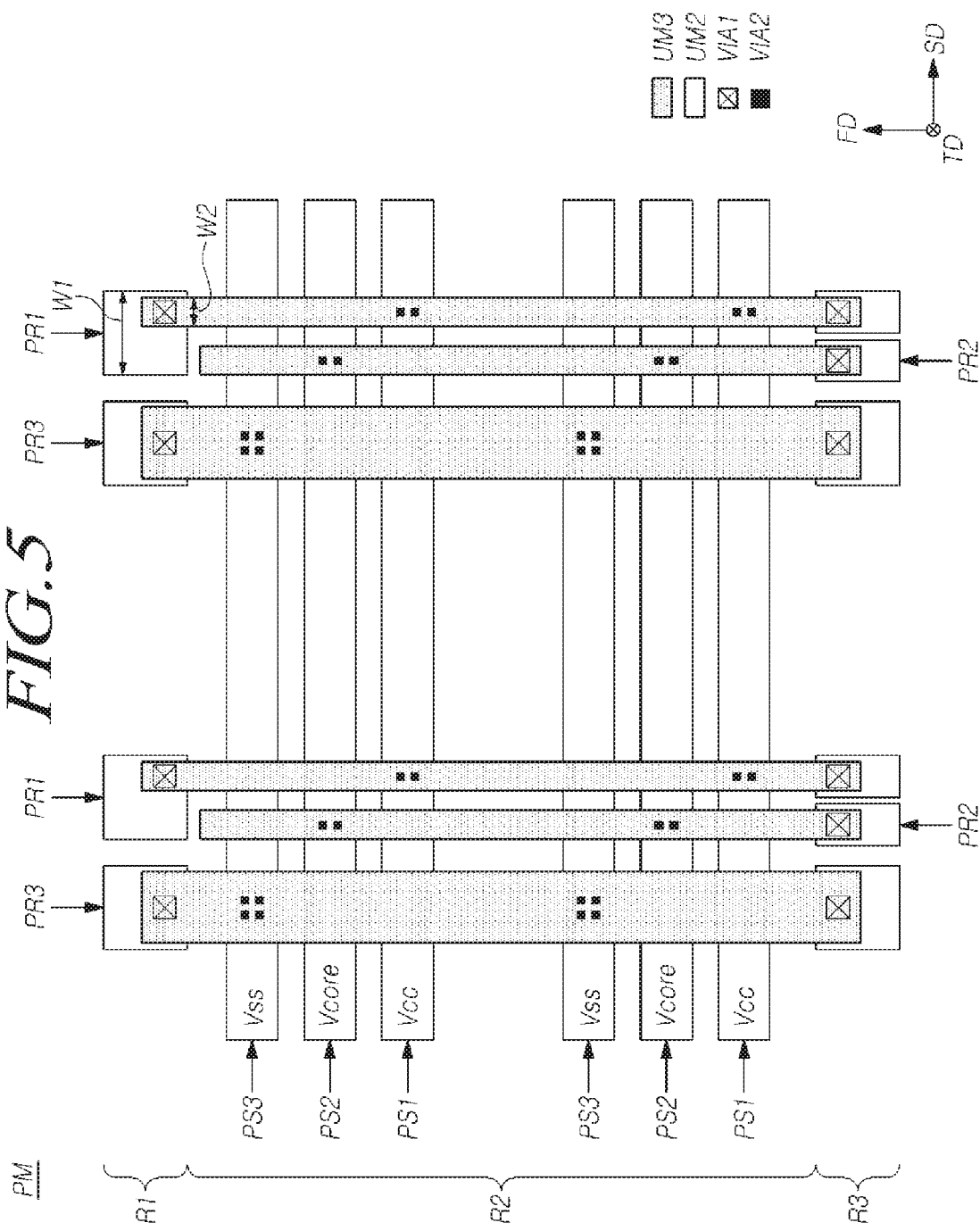
FIGS. 5 and 6 are enlarged top views for parts of FIG. 4.
Figure 6:
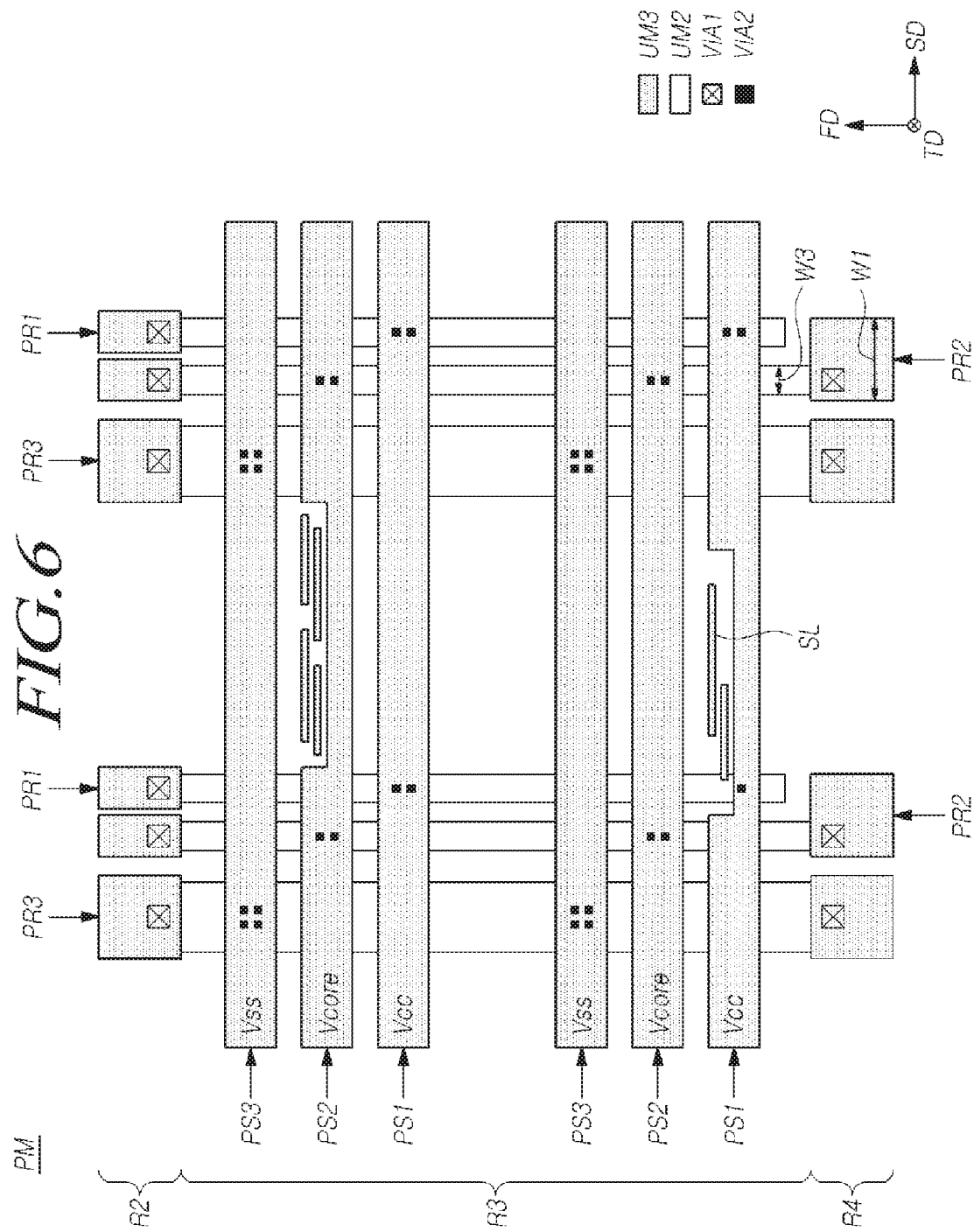

FIG. 4 is a top view schematically illustrating a representation of an example of the power mesh PM of the semiconductor device 100 in accordance with an embodiment of the invention disclosure. FIGS. 5 and 6 are enlarged top views for parts of FIG. 4.

Referring to FIGS. 4 to 6, first to fourth regions R1 to R4 may be defined in the substrate 10 in the first direction FD.

Internal circuits may be disposed on the substrate 10. The internal circuits may include first logic circuits which are disposed on the first and third regions R1 and R3 of the substrate 10 and second logic circuits which are disposed on the second and fourth regions R2 and R4 of the substrate 10. The first logic circuits may correspond to the peripheral circuits 140-1 and 140-2 illustrated in FIG. 2, and the second logic circuits may correspond to the page buffer circuits 130-1 to 130-4 illustrated in FIG. 2.

The power mesh PM may be disposed in the bottom metal layers of the first to fourth regions R1 to R4. When viewed from the top, the power mesh PM may include power lines PR1 to PR3 which extend in the first direction FD and power straps PS1 to PS3 which extend in the second direction SD and are coupled to the power lines PR1 to PR3. More specifically, the power straps PS1 may be coupled to the power lines PR1, the power straps PS2 may be coupled to power lines PR2, and the power straps PS3 may be coupled to power lines PR3.

In the present specification, among elements configuring the power mesh PM, elements which extend in the first direction FD when viewed from the top will be defined as power lines, and elements which extend in the second direction SD when viewed from the top will be defined as power straps. The reason why the terms are differently defined depending on an extending direction is merely to facilitate the understanding of the invention disclosure, and it is to be understood that the power lines and the power straps are different only in terms of extending direction and perform the same or substantially the same function.

As will be described below, it is illustrated in the present specification that the power lines are disposed in the second and third bottom metal layers UM2 and UM3 and the power straps are disposed in the second and third bottom metal layers UM2 and UM3, but it is to be noted that the disclosure is not limited thereto. For example, it is envisaged that the power lines may be disposed in one of the bottom metal layers UM1 to UM3 and the power straps are disposed in another one of the bottom metal layers UM1 to UM3.

The power lines PR1 to PR3 may be divided into first to third power lines PR1 to PR3 depending on the kind of an operating voltage to be transmitted. The power straps PS1 to PS3 may also be divided into first to third power straps PS1 to PS3 depending on the kind of an operating voltage to be transmitted.

The first power lines PR1 and the first power straps PS1 coupled thereto may transmit a first operating voltage to the first logic circuits which are disposed on the first and third regions R1 and R3, for example, the peripheral circuits 140-1 and 140-2 (see FIG. 2). The first operating voltage may be the power supply voltage Vcc.

The second power lines PR2 and the second power straps PS2 coupled thereto may transmit a second operating voltage to the second logic circuits which are disposed on the second and fourth regions R2 and R4, for example, the page buffer circuits 130-1 to 130-4 (see FIG. 2). The second operating voltage may be the core voltage Vcore.

The third power lines PR3 and the third power straps PS3 coupled thereto may transmit a third operating voltage to the first logic circuits and the second logic circuits which are disposed on the first to fourth regions R1 to R4, that is, the peripheral circuits 140-1 and 140-2 and the page buffer circuits 130-1 to 130-4. The third operating voltage may be the ground voltage Vss.

The first power lines PR1 and the second power lines PR2 may share lanes. For example, one first power line PR1 and one second power line PR2 may share one lane. As used herein, the term 'lane' may be defined as a line-shaped design section that extends in the first direction FD or the second direction SD and has a predetermined width. The power lines PR1 to PR3 may be disposed on lanes that extend in the first direction FD, and the power straps PS1 to PS3 may be disposed on lanes that extend in the second direction SD. The lane width of each of the power lines PR1 to PR3 may be a first width W1. The lane width of each of the power straps PS1 to PS3 may be smaller than the lane width of each of the power lines PR1 to PR3, that is, the first width W1, as illustrated in FIGS. 4 to 6. On the other hand, while not illustrated, the lane width of each of the power straps PS1 to PS3 may be the same or substantially the same as or larger than the first width W1.

When viewed from the top, the first power lines PR1 may extend from the first region R1 to the third region R3 in the first direction FD, and the second power lines PR2 may extend from the fourth region R4 to the second region R2 in the first direction FD. Due to this fact, the first power lines PR1 and the second power lines PR2 may overlap with each other in the second direction SD in the second region R2 and the third region R3.

The third power lines PR3 may be disposed on separate lanes from the first and second power lines PR1 and PR2. When viewed from the top, the third power lines PR3 may extend from the first region R1 to the fourth region R4 in the first direction FD.

The lanes on which the first and second power lines PR1 and PR2 are disposed and the lanes on which the third power lines PR3 are disposed may be alternately disposed in the second direction SD. The third power lines PR3 may be repeatedly disposed with a constant pitch in the second direction SD, and one first power line PR1 and one second power line PR2 which share a lane may be disposed between adjacent third power lines PR3.

Each of the first to third power lines PR1 to PR3 may be formed as metal lines which are disposed in the second bottom metal layer UM2 and metal lines which are disposed in the third bottom metal layer UM3 are coupled through first vertical vias VIA1 which pass through the bottom dielectric layer disposed between the second bottom metal layer UM2 and the third bottom metal layer UM3. The metal lines which configure the first to third power lines PR1 to PR3 may be disposed in the second bottom metal layer UM2 in the first and third regions R1 and R3, and may be disposed in the third bottom metal layer UM3 in the second and fourth regions R2 and R4.

In the case where the first to third power lines PR1 to PR3 are disposed in the second bottom metal layer UM2 in the first and third regions R1 and R3 and are disposed in the third bottom metal layer UM3 in the second and fourth regions R2 and R4, the first to third power straps PS1 to PS3 may be disposed in the third bottom metal layer UM3 in the first and third regions R1 and R3 and may be disposed in the second bottom metal layer UM2 in the second and fourth regions R2 and R4.

The first to third power lines PR1 to PR3 and the first to third power straps PS1 to PS3 may intersect with each other at a plurality of intersections. At least one second conductive via VIA2, which is also referred as second vertical via, may be formed in the vertical direction at each of the intersections to electrically couple the first power lines PR1 with the first power straps PS1, the second power lines PR2 with the second power straps PS2 and the third power lines PR3 with the third power straps PS3.

The first power straps PS1 may be disposed in the first to third regions R1 to R3, and may be meshed with the first power lines PR1 in the first to third regions R1 to R3. The second power straps PS2 may be disposed in the second to fourth regions R2 to R4, and may be meshed with the second power lines PR2 in the second to fourth regions R2 to R4.

The third power straps PS3 may be disposed in the first to fourth regions R1 to R4, and may be meshed with the third power lines PR3 in the first to fourth regions R1 to R4.

The first power lines PR1 and the second power lines PR2 which share lanes may overlap with each other in the second direction SD in the second and third regions R2 and R3. The first power lines PR1 and the second power lines PR2 may each have a reduced width in a section in which they overlap with each other. The first power lines PR1 and the second power lines PR2 may each have a width of the same size as the lane width in a section in which they do not overlap with each other.

In detail, the first power lines PR1 may each have the first width W1 in the first region R1, and may each have a second width W2 smaller than the first width W1 in the second and third regions R2 and R3. The second power lines PR2 may each have the first width W1 in the fourth region R4, and may each have a third width W3 smaller than the first width W1 in the second and third regions R2 and R3. The first width W1 may correspond to the width of the lane which is shared by the first power line PR1 and the second power line PR2.

In the second and third regions R2 and R3, at least one of the first power straps PS1 may be meshed with reduced width portions of the first power lines PR1. In the second and third regions R2 and R3, at least one of the second power straps PS2 may be meshed with reduced width portions of the second power lines PR2.

In this way, because the first power lines PR1 and the second power lines PR2 have the reduced widths in the second and third regions R2 and R3 where they overlap with each other, each first power line PR1 and each second power line PR2 may share a lane even without increasing the width of the lane. However, if the widths of the first power lines PR1 and the second power lines PR2 are reduced, the series resistance component of the power mesh PM may increase.

Referring to FIG. 6, signal lines SL may be disposed in the second and third bottom metal layers UM2 and UM3. The signal lines SL may share a lane with at least one of the first to third power lines PR1 to PR3 and the first to third power straps PS1 to PS3.

More specifically, FIG. 6 illustrates a case where the signal lines SL share lanes with the first power strap PS1 and the second power strap PS2. The first power strap PS1 and the second power strap PS2 may have reduced widths in sections where they overlap with the signal lines SL. In detail, the first power strap PS1 and the second power strap PS2 may have a width of the same size as the width of each lane in sections where they do not overlap with the signal lines SL, and may have widths smaller than the width of each lane in sections where they overlap with the signal lines SL.

While not illustrated, in the case where signal lines SL share lanes with the first to third power lines PR1 to PR3 and the third power strap PS3, the first to third power lines PR1 to PR3 and the third power strap PS3 may also have reduced widths in sections where they overlap with the signal lines SL. According to this fact, it is possible to avoid the interference between the signal lines SL and the power mesh PM, without an increase in a layout area due to the presence of the signal lines SL. However, if the widths of the power lines PR1 to PR3 and the power straps PS1 to PS3 are reduced in this way, the series resistance component of the power mesh PM may increase.

Figure 7:
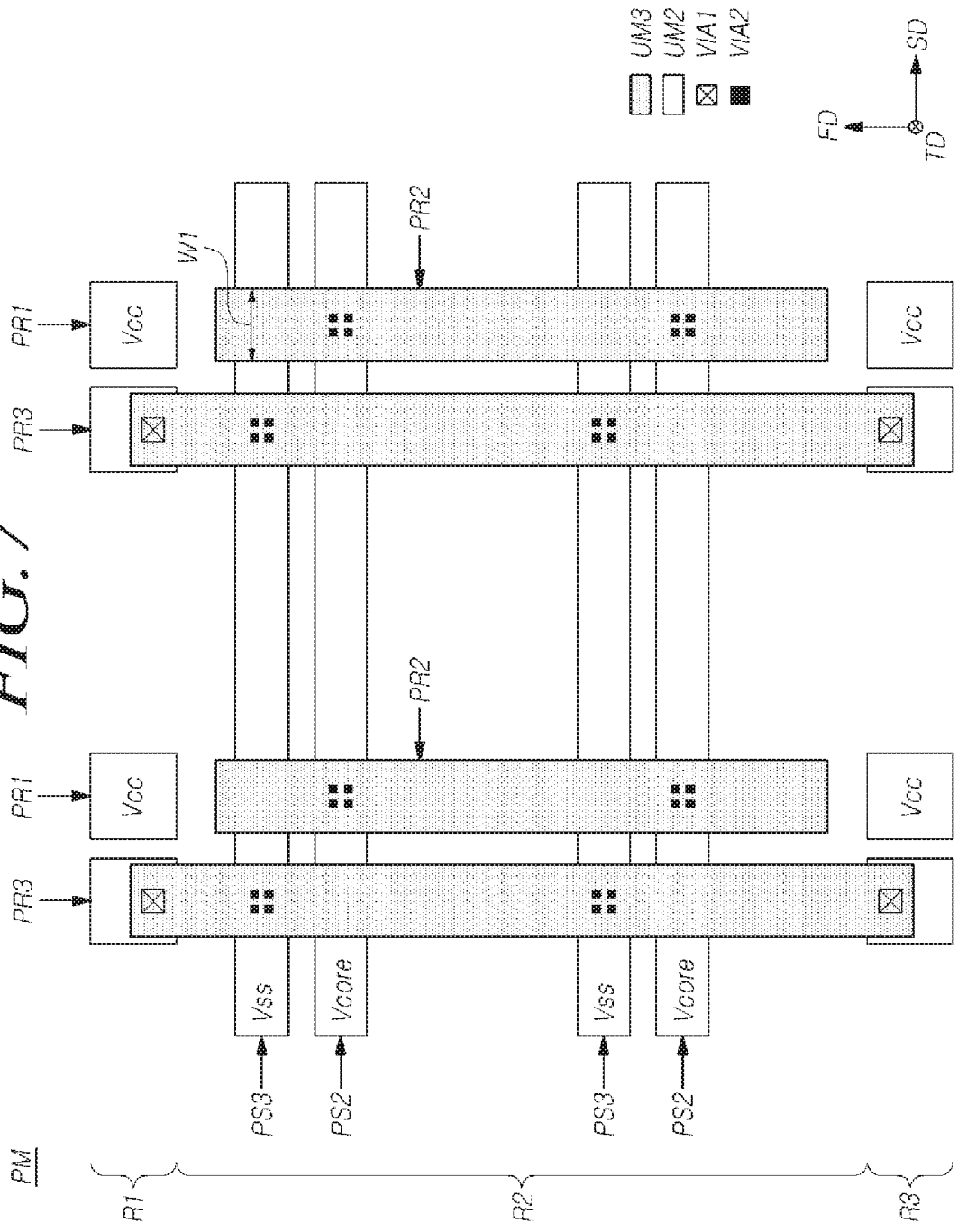
FIGS. 7 and 8 are top views illustrating a schematic representation of an example of a power mesh of a semiconductor device related with the disclosure.
Figure 8:
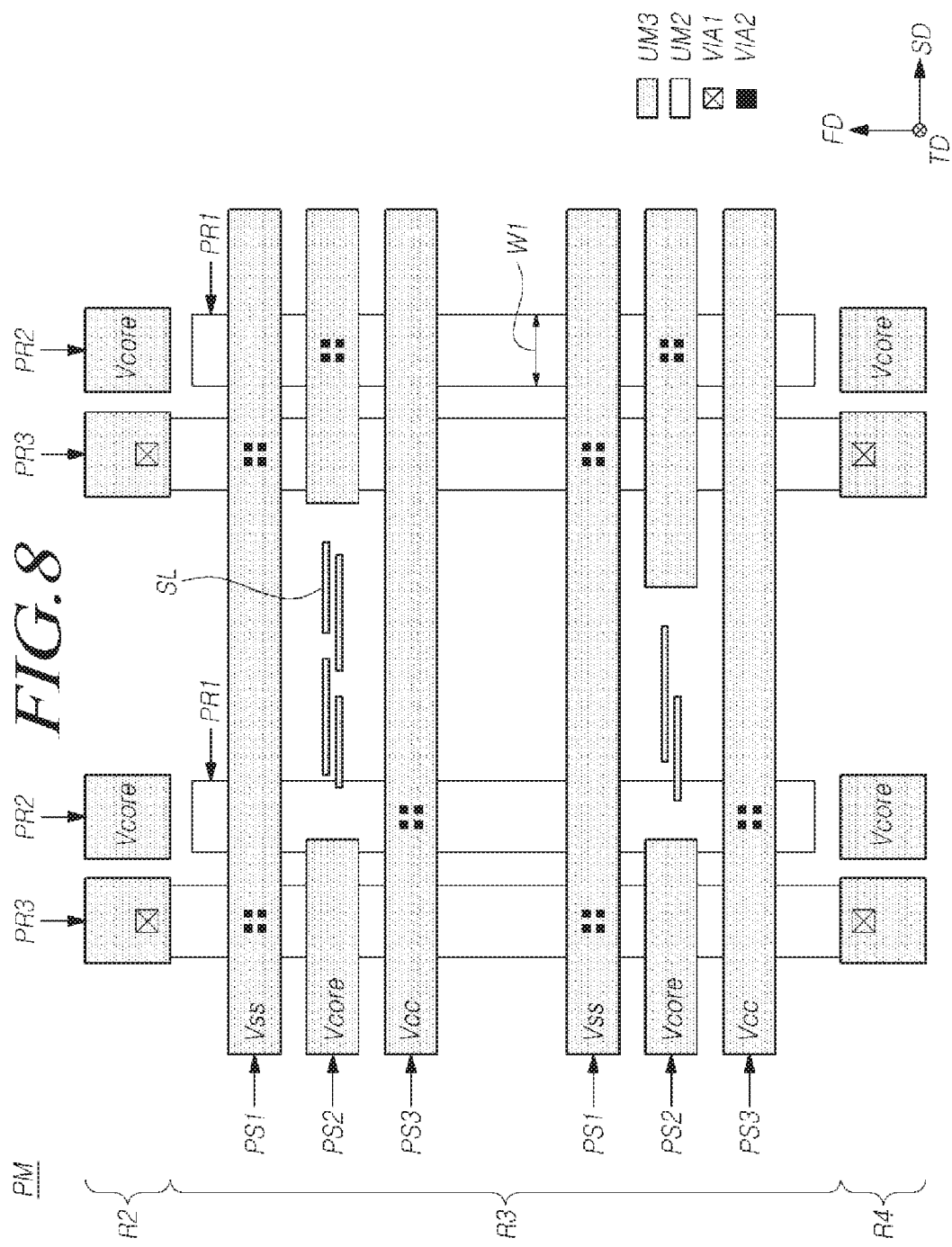

FIGS. 7 and 8 are top views illustrating a schematic representation of an example of a power mesh structure of a semiconductor device related with the disclosure.

Referring to FIG. 7, logic circuits which are disposed in a second region R2 are provided with operating voltages from second power lines PR2, and are not provided with operating voltages from first power lines PR1. The first power lines PR1 may be cut and removed in the second region R2. The second power lines PR2 may be disposed at sections where the first power lines PR1 are removed. In this case, the width of each of the second power lines PR2 in the second region R2 may be increased to the same size as a lane width W1, and accordingly, the series resistance component of a power mesh PM may be reduced.

Referring to FIG. 8, logic circuits which are disposed in a third region R3 are provided with operating voltages from the first power lines PR1, and are not provided with operating voltages from the second power lines PR2. The second power lines PR2 may be cut and removed in the third region R3. The first power lines PR1 may be disposed at sections where the second power lines PR2 are removed. In this case, the width of each of the first power lines PR1 in the third region R3 may be increased to the same size as the lane width W1, and accordingly, the series resistance component of the power mesh PM may be reduced.

The second power straps PS2 may be cut to avoid interference with signal lines SL. While not illustrated, first to third power lines PR1 to PR3 and first and third power straps PS1 and PS3 may also be cut to avoid interference with signal lines.

However, if the power lines PR1 to PR3 and the power straps PS1 to PS3 are cut in this way, the coupling between the power lines PR1 to PR3 and the power straps PS1 to PS3 may be impossible in cut sections. Accordingly, as the number of parallel coupling sections included in the power mesh PM decreases, the parallel resistance component of the power mesh PM may increase.

Tests were conducted to determine which case is advantageous in reducing the resistance of the power mesh PM, between a case (the present embodiment) where the number of parallel coupling sections of the power mesh PM is increased by reducing the widths of power lines and power straps without cutting them in bottleneck sections of metal lines (power lines, power straps and signal lines) and a case (the comparative example illustrated in FIGS. 7 and 8) where some power lines and power straps are cut and the other power lines and power straps are formed wide to have widths the same as lane widths, in the metal line bottleneck sections, and test processes and results are shown in FIGS. 9 to 17.

Figure 9:
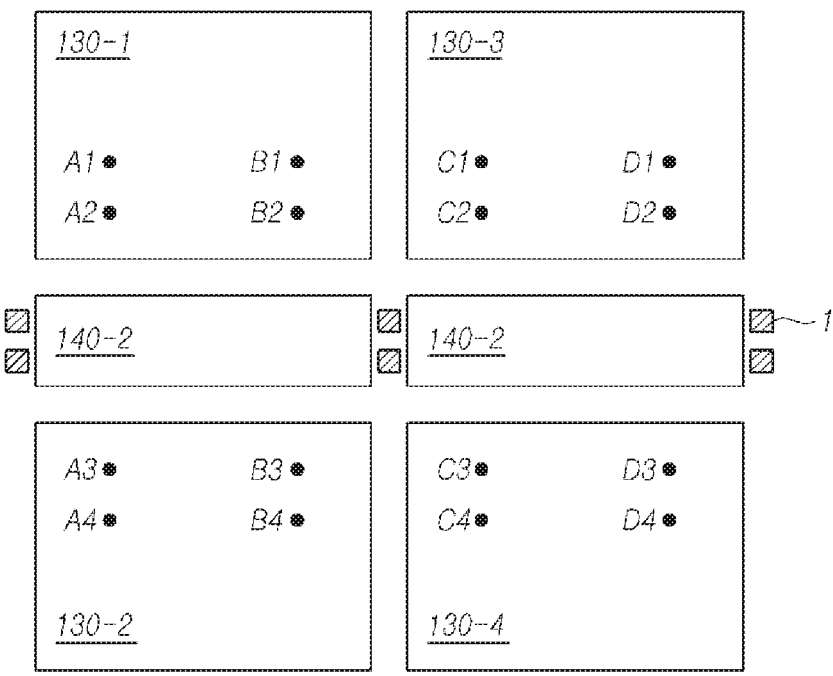
FIGS. 9 to 17 are representations of examples of diagrams to assist in the explanation of processes for testing effects of the invention disclosure and test results.
Figure 10:
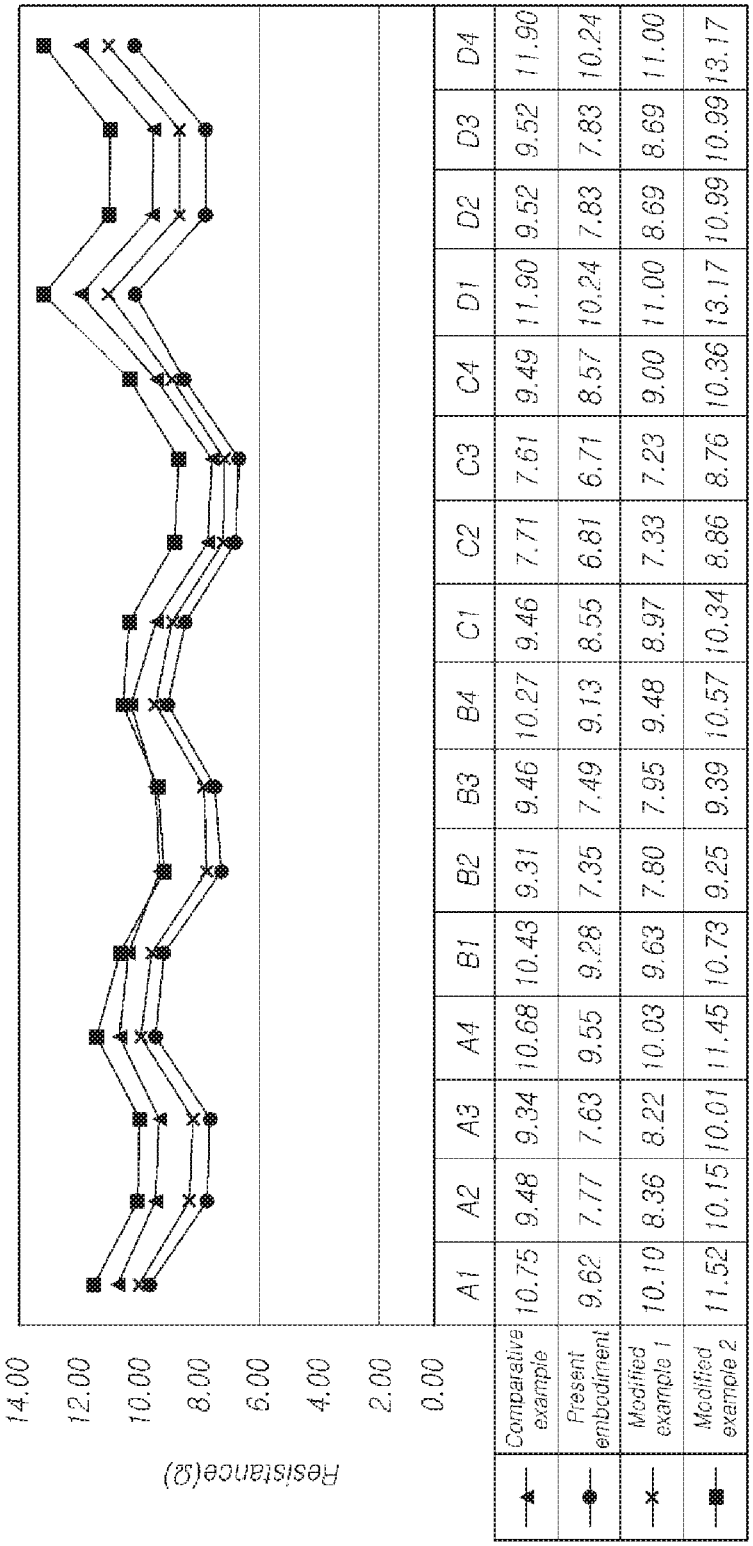
Figure 11:
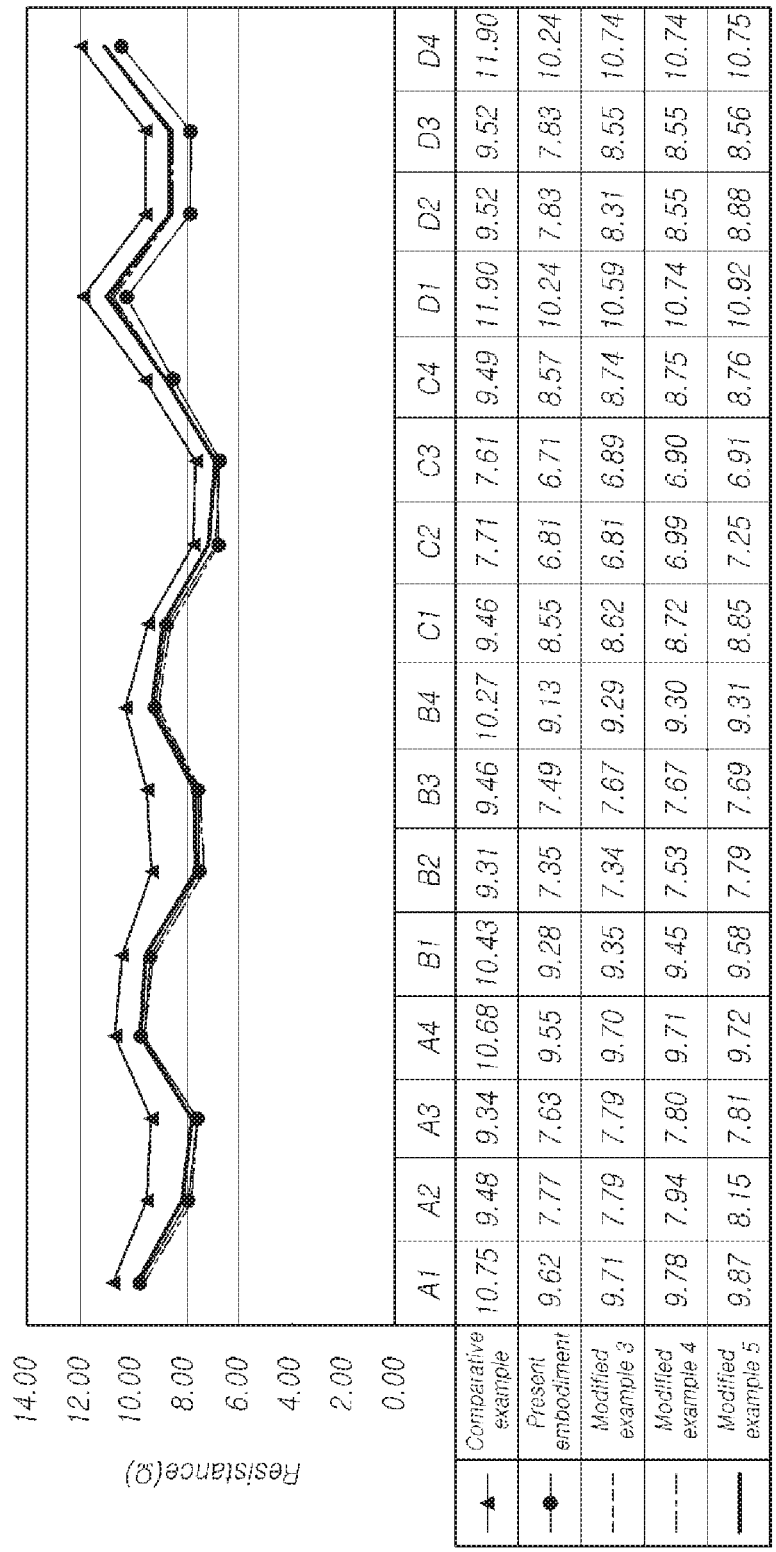
Figure 12:
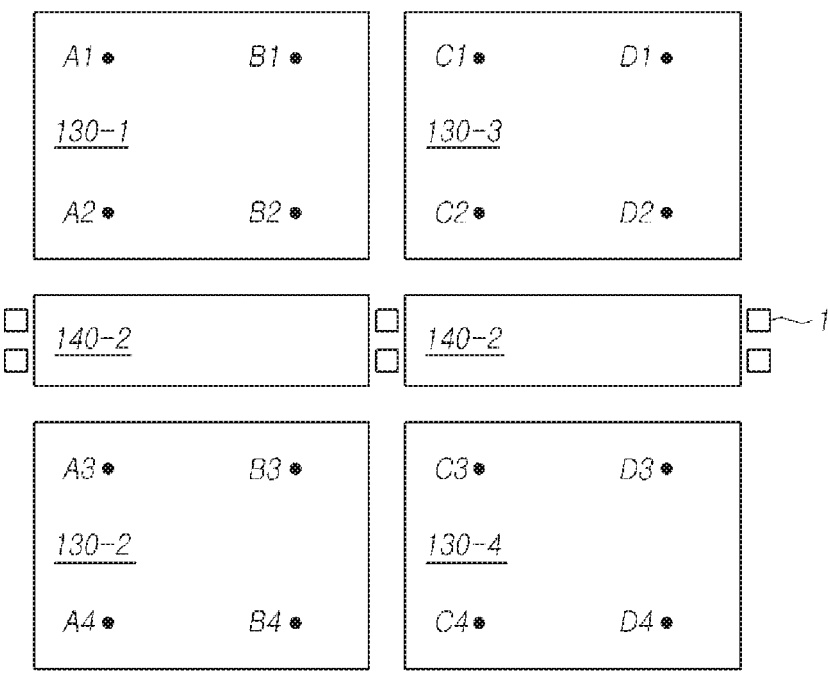
Figure 13:
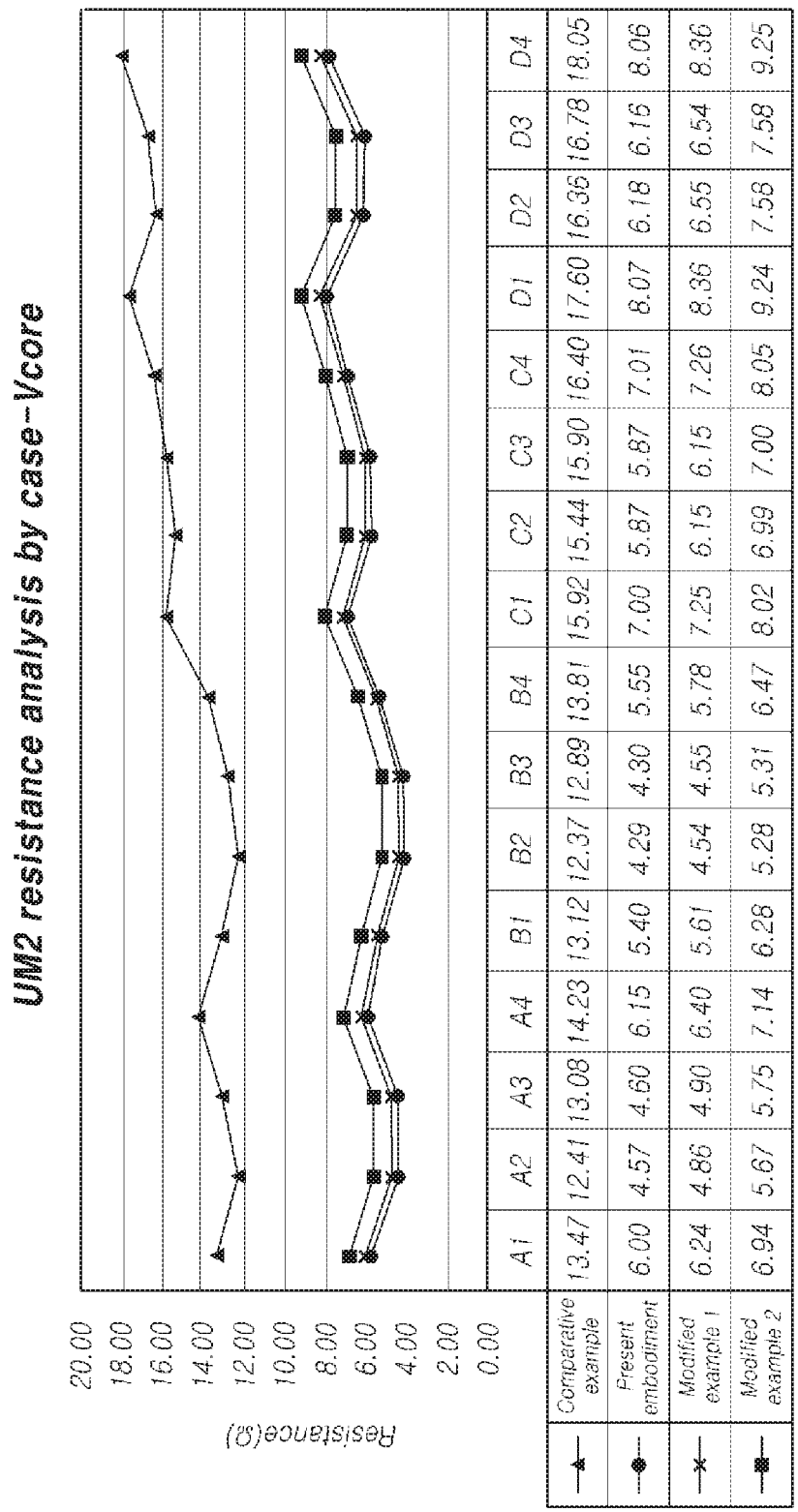
Figure 14:
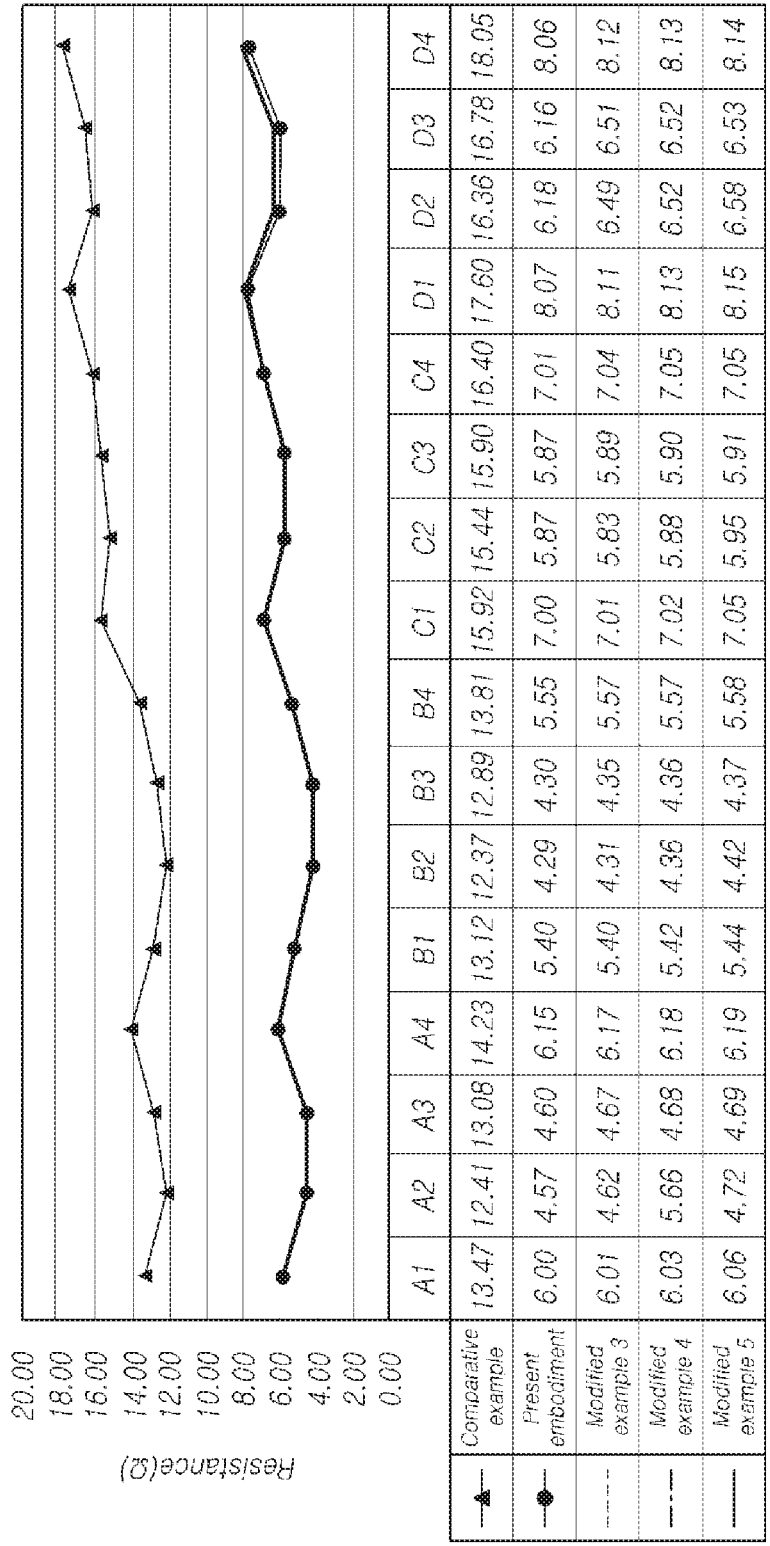
Figure 15:
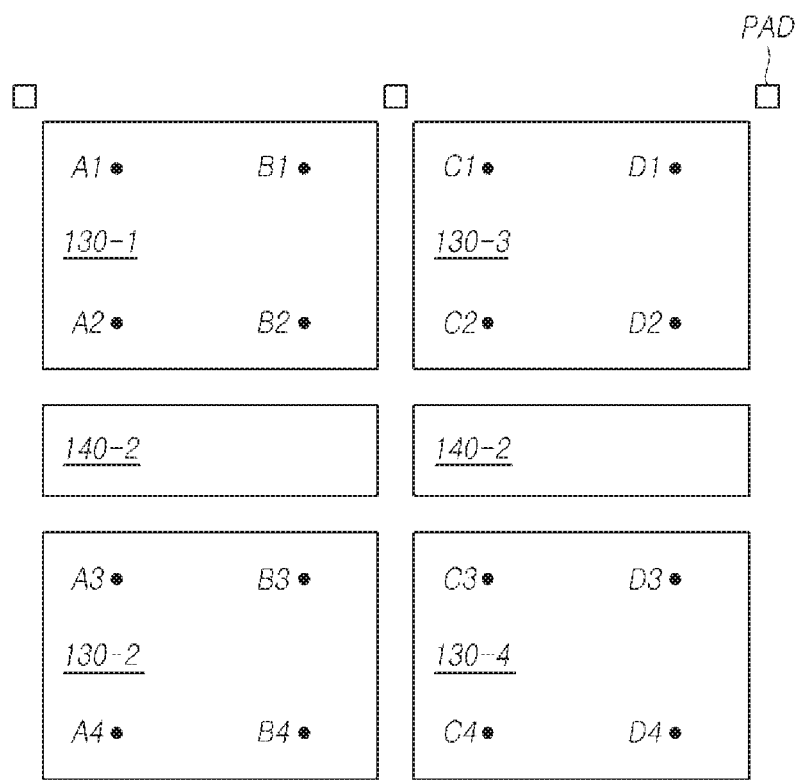
Figure 16:
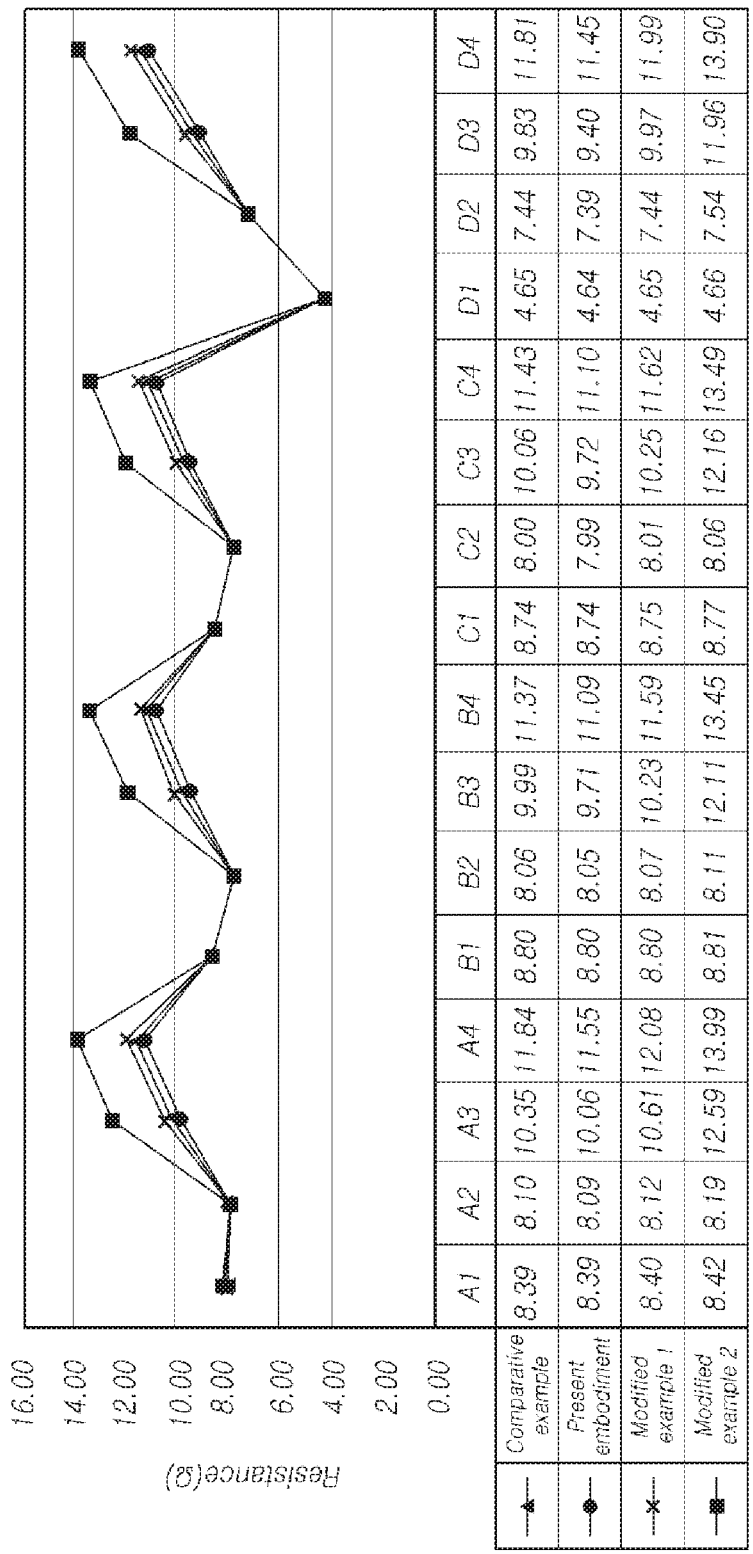
Figure 17:
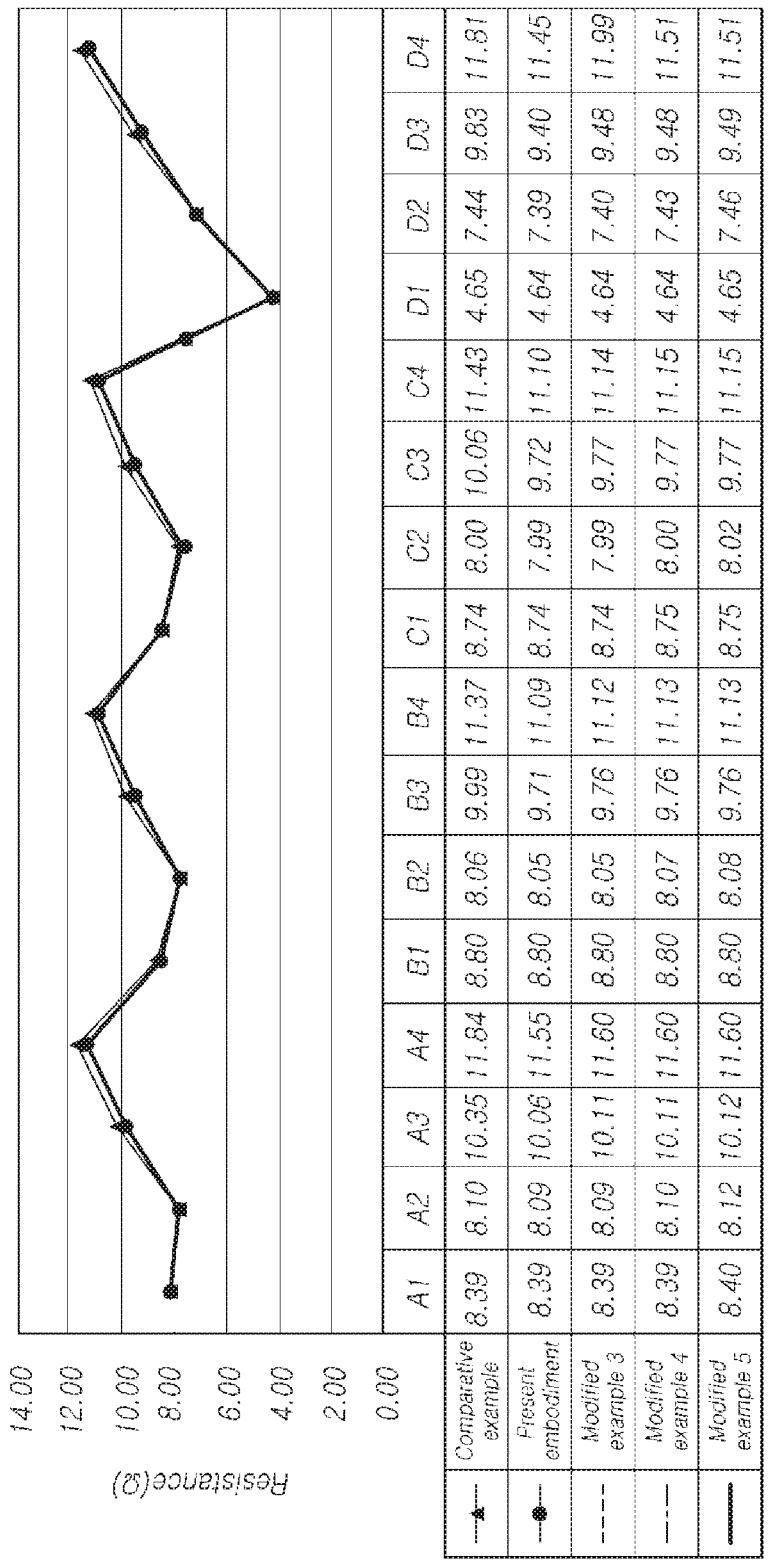

FIGS. 9 to 17 are representations of examples of diagrams to assist in the explanation of test processes and results for verifying effects of the invention disclosure. In detail, FIGS. 9 to 11 show a resistance measurement process and measurement results for a Vcc power mesh, FIGS. 12 to 14 show a resistance measurement process and measurement results for a Vcore power mesh, and FIGS. 15 to 17 show a resistance measurement process and measurement results for a Vss power mesh.

In FIGS. 10 and 11, FIGS. 13 and 14 and FIGS. 16 and 17, a comparative example and modified examples 1 to 5 are disclosed.

The present embodiment represents a case where the lane widths of power lines and power straps disposed in the second bottom metal layer UM2 are 1.02 μm, the lane intervals of power lines and power straps disposed in the second bottom metal layer UM2 are 12.6 μm, the lane widths of power lines and power straps for Vcc disposed in the third bottom metal layer UM3 are 164.1 μm, the lane widths of power lines and power straps for Vcore disposed in the third bottom metal layer UM3 are 92.7 μm, and the lane widths of power lines and power straps for Vss disposed in the third bottom metal layer UM3 are 108.2 μm.

The comparative example represents a case where some power lines and power straps are cut and the other power lines and power straps are formed wide to have widths the same as lane widths in metal line bottleneck sections as illustrated in FIGS. 7 and 8.

The modified example 1 represents a case where the lane widths of power lines and power straps disposed in the second bottom metal layer UM2 are 0.78 μm which narrow in comparison with the structure of the present embodiment, and others are same as the structure of the present embodiment.

The modified example 2 represents a case where the lane widths of power lines and power straps disposed in the second bottom metal layer UM2 are 0.78 μm which narrow in comparison with the present embodiment, lane intervals of power lines and power straps disposed in the second bottom metal layer UM2 are 25.2 μm which wide in comparison with the structure of the present embodiment, and others are same as the structure of the present embodiment.

The modified example 3 represents a case where the lane widths of power lines and power straps for Vcc disposed in the third bottom metal layer UM3 are 155.9 μm which narrow in comparison with the structure of the present embodiment, the lane widths of power lines and power straps for Vcore disposed in the third bottom metal layer UM3 are 101.5 μm which wide in comparison with the structure of the present embodiment, the lane widths of power lines and power straps for Vss disposed in the third bottom metal layer UM3 are 123.9 μm which wide in comparison with the structure of the present embodiment, and others are same as the structure of the present embodiment.

The modified example 4 represents a case where the lane widths of power lines and power straps disposed in the third bottom metal layer UM3 for Vcc are 126 μm which narrow in comparison with the structure of the present embodiment, the lane widths of power lines and power straps disposed in the third bottom metal layer UM3 for Vcore are 71.6 μm which narrow in comparison with the structure of the present embodiment, the lane widths of power lines and power straps disposed in the third bottom metal layer UM3 for Vss are 94 μm which narrow in comparison with the structure of the present embodiment, and others are same as the structure of the present embodiment.

The modified example 5 represents a case where the lane widths of power lines and power straps disposed in the third bottom metal layer UM3 for Vcc are 115.6 μm which narrow in comparison with the structure of the modified example 4, the lane widths of power lines and power straps disposed in the third bottom metal layer UM3 for Vcore are 61.2 μm which narrow in comparison with the structure of the modified example 4, and the lane widths of power lines and power straps disposed in the third bottom metal layer UM3 for Vss are 83.6 μm which narrow in comparison with the structure of the modified example 4, and others are same as with the structure of the modified example 4.

As illustrated in FIG. 9, Vcc power mesh resistance values were measured at a plurality of points A1 to D4 based on LDO regulators 1, and results thereof are shown in FIGS. 10 and 11.

As shown in FIG. 10, in the case of the present embodiment, Vcc power mesh resistance values that are significantly lower than those of the comparative example were measured. Even in the case of the modified example 1, Vcc power mesh resistance values that are lower than those of the comparative example were measured. The present embodiment and the modified example 1 do not show a substantial difference in the Vcc power mesh resistance values. However, in the modified example 2, Vcc power mesh resistance values that are slightly higher than those of the comparative example were measured.

Referring to FIG. 11, in all of the modified example 3 to the modified example 5, Vcc power mesh resistance values that are lower than those of the comparative example were measured. The present embodiment and the modified example 3 to the modified example 5 do not show a substantial difference in the Vcc power mesh resistance values.

As illustrated in FIG. 12, Vcore power mesh resistance values were measured at a plurality of points A1 to D4 based on LDO regulators 1, and results thereof are shown in FIGS. 13 and 14.

As shown in FIG. 13, in all of the present embodiment and the modified examples 1 and 2, Vcore power mesh resistance values that are significantly lower than those of the comparative example were measured. The present embodiment and the modified examples 1 and 2 do not show a substantial difference in the Vcore power mesh resistance values.

Referring to FIG. 14, in the modified example 3 to the modified example 5, Vcore power mesh resistance values that are significantly lower than those of the comparative example were measured. The present embodiment and the modified examples 3, 4 and 5 do not show a substantial difference in the Vcore power mesh resistance values.

As illustrated in FIG. 15, Vss power mesh resistance values were measured at a plurality of points A1 to D4 based on Vss input/output pads PAD, and results thereof are shown in FIGS. 16 and 17.

As shown in FIG. 16, the present embodiment, the modified example 1 and the comparative example do not show a substantial difference in the Vss power mesh resistance values. However, in the case of the modified example 2, it was observed that it has Vss power mesh resistance values slightly higher than those of the comparative example.

As shown in FIG. 17, the modified example 3 to the modified example 5 and the comparative example do not show a substantial difference in the Vss power mesh resistance values.

By the above-described test results, it may be seen that the case where power lines and power straps are coupled in metal line bottleneck sections even though the widths thereof are reduced is considerably advantageous in reducing Vcc power mesh resistances and Vcore power mesh resistances, in comparison with the case where some power lines and power straps are cut and the other power lines and power straps are formed wide to have widths the same as lane widths, in the metal line bottleneck sections. Because it is possible to reduce Vcc power mesh resistances and Vcore power mesh resistances in the case of using the present embodiment, it is possible to suppress a voltage drop that occurs while an operating voltage is transmitted through a power mesh.

Moreover, because Vcc power mesh resistance values, Vcore power mesh resistance values and Vss power mesh resistance values do not show a substantial difference even though the lane widths of power lines and power straps are reduced in the structure of the present embodiment, it is possible to reduce the lane widths of Vcc power lines, Vcore power lines, Vss power lines, Vcc power straps, Vcore power straps and Vss power straps. Thus, since it is possible to reduce the lane widths of power lines and power straps by using the present embodiment, it is possible to contribute to the reduction in the size of a semiconductor device.

FIG. 18 is a circuit diagram illustrating a schematic representation of an example of a portion of the memory cell array illustrated in FIG. 1. FIG. 18 illustrates one memory block BLKi among the memory blocks BLK1 to BLKz included in the memory cell array.

Referring to FIG. 18, the memory block BLKi may include a plurality of cell strings CSTR which are connected between a plurality of bit lines BL and a common source line CSL.

The bit lines BL may extend in the first direction FD and be arranged in the second direction SD. A plurality of cell strings CSTR may be connected in parallel to each of the bit lines BL. Cell strings CSTR which are disposed in a line in the first direction FD may be coupled to a single bit line BL.

Each of the cell strings CSTR may include a drain select transistor DST which is connected to a bit line BL, a source select transistor SST which is connected to the common source line CSL, and a plurality of memory cells MC which are connected between the drain select transistor DST and the source select transistor SST. The drain select transistor DST, the memory cells MC and the source select transistor SST may be coupled in series in the third direction TD.

Drain select lines DSL, a plurality of word lines WL and a source select line SSL which extend in the second direction SD may be stacked in the third direction TD between the bit lines BL and the common source line CSL. The drain select lines DSL may be coupled to the gates of corresponding drain select transistors DST, respectively. The word lines WL may be connected to the gates of corresponding memory cells MC, respectively. The source select line SSL may be connected to the gates of source select transistors SST.

Figure 19:
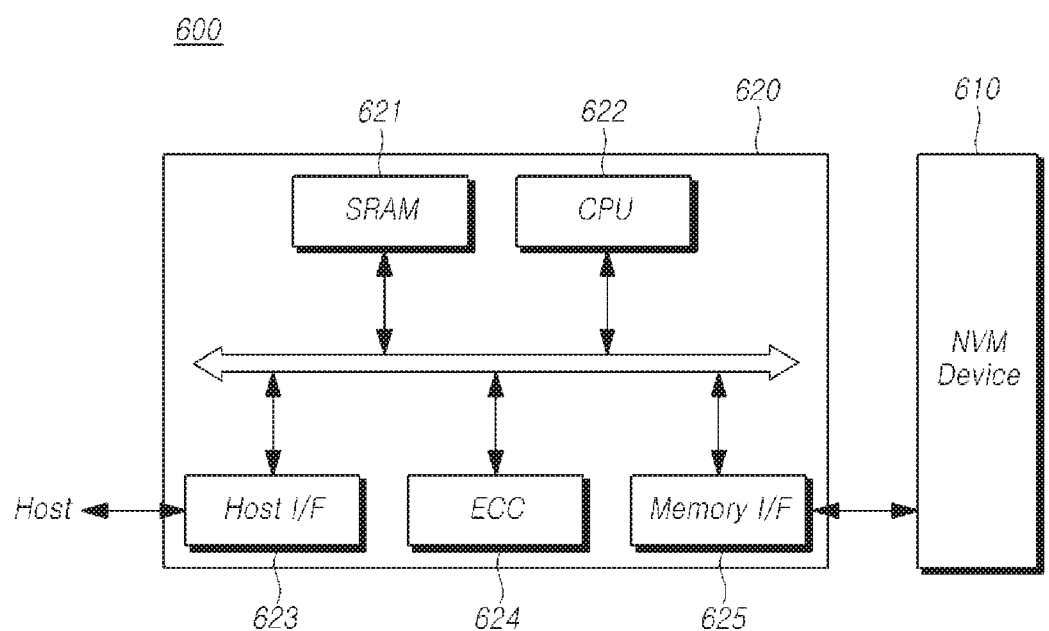
FIG. 19 is a block diagram schematically illustrating a memory system including a semiconductor device in accordance with an embodiment of the invention disclosure.

FIG. 19 is a simplified block diagram schematically illustrating a memory system including a semiconductor memory device according to an embodiment of the present invention.

Referring to FIG. 19, the memory system 600 may include the nonvolatile memory device 610 and a memory controller 620.

The nonvolatile memory device 610 may comprise the nonvolatile memory device according to an embodiment of the invention as described above, and may operate in the manner described above.

The memory controller 620 may control the nonvolatile memory device 610. For example, the combination of the nonvolatile memory device 610 and the memory controller 620, may be configured as a memory card or a solid state disk (SSD). The memory controller 620 may include an SRAM 621, a central processing unit (CPU) 622, a host interface 623, an error correction circuit (ECC) block 624, a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the nonvolatile memory device 610.

The memory interface 625 may interface with the nonvolatile memory device 610. The CPU 622 may perform general control operations for data exchange of the memory controller 620.

Although not shown, it should become apparent to a person skilled in the art that the memory system 600 may further be provided with a ROM which stores code data for interfacing with the host. The nonvolatile memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 20:
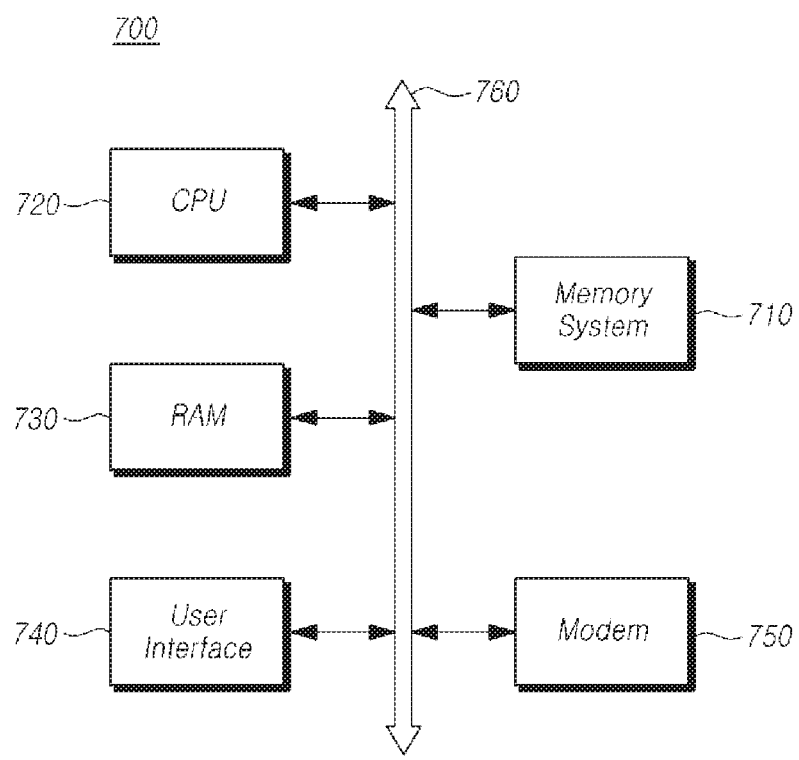
FIG. 20 is a block diagram schematically illustrating a representation of an example of a computing system including a semiconductor device in accordance with an embodiment of the invention disclosure.

FIG. 20 is a simplified block diagram schematically illustrating a computing system including a semiconductor memory device, according to an embodiment of the present invention.

Referring to FIG. 20, a computing system 700 according to an embodiment may include a memory system 710, a microprocessor (or CPU) 720, a RAM 730, a user interface 740, a modem 750 such as a baseband chipset, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a CAMS image sensor (CIS), a mobile DRAM, and so on. The memory system 710 may be configured, for example, as an SSD (solid state drive/disk) which uses a nonvolatile memory to store data. Also, as an example, the memory system 710 may be provided as a fusion flash memory (for example, a NAND or a NOR flash memory).

While various embodiments have been described above, it will be understood to those skilled in the art that the embodiments described are by way of example only. Accordingly, the semiconductor device described herein should not be limited based on the described embodiments and may encompass all variations of the described embodiments that fall within the scope of the present invention as defined in the accompanying claims.

What is claimed is:

1. A semiconductor device comprising:
an internal circuit and a power mesh configured to transmit an operating voltage to the internal circuit,
the power mesh comprising:
a plurality of first power lines extending in a first direction and arranged in a second direction intersecting with the first direction, when viewed from a top;
a plurality of second power lines sharing lanes with the first power lines and at least partially overlapping with the first power lines in the second direction;
a plurality of first power straps extending in the second direction and coupled to the first power lines; and
a plurality of second power straps extending in the second direction and coupled to the second power lines,
wherein each of the first and the second power lines has a width of the same size as a width of each lane in sections where they do not overlap with each other, and a width of a size smaller than the width of each lane in sections where they overlap with each other.

2. The semiconductor device according to claim 1, further comprising:
third power lines disposed between adjacent lanes of the first and second power lines, each of the third power lines extending in the first direction in parallel to the first and second power lines and having a first width which is the same as the width of each lane along an entire length of the third power line.

3. The semiconductor device according to claim 1, wherein at least one of the first power straps is coupled to reduced width portions of the first power lines, and at least one of the second power straps is coupled to reduced width portions of the second power lines.

4. A semiconductor device comprising:
an internal circuit, a power mesh configured to transmit an operating voltage to the internal circuit, and a signal line configured to provide a signal routing,
the power mesh comprising
a plurality of power lines extending in a first direction and arranged in a second direction intersecting with the first direction, when viewed from a top; and
a plurality of power straps extending in the second direction and coupled to the power lines,
wherein the signal line shares a lane with at least one of the power lines and the power straps, and each of the power lines and the power straps has a width of the same size as a width of the lane in sections where they do not overlap with the signal line and a width of a size smaller than the width of the lane in sections where they overlap with the signal line.

5. The semiconductor device according to claim 4, wherein at least one of the power straps is coupled to reduced width portions of the power lines.

6. A semiconductor device comprising:
a memory structure including a plurality of memory cells, and a logic structure,
wherein the logic structure comprises a substrate, logic circuits which are disposed over the substrate and control operations of the memory cells, and a plurality of metal layers including a power mesh which is disposed over the logic circuits and transmits operating voltages to the logic circuits,
wherein the substrate comprises first to fourth regions which are defined in a first direction,
wherein the logic circuits comprise first logic circuits which are disposed over the first and third regions and second logic circuits which are disposed over the second and fourth regions,
wherein the power mesh comprises:
a plurality of first power lines extending in the first direction and arranged in a second direction intersecting with the first direction, when viewed from a top, and configured to transmit a first operating voltage to the first logic circuits;
a plurality of second power lines sharing lanes with the first power lines, and configured to transmit a second operating voltage to the second logic circuits;
a plurality of first power straps extending in the second direction and coupled to the first power lines; and
a plurality of second power straps extending in the second direction and coupled to the second power lines, and
wherein the first power lines are continuous from the first region to the third region and have a reduced width in the second and third regions, and the second power lines are continuous from the second region to the fourth region and have a reduced width in the second and third regions.

7. The semiconductor device according to claim 6, wherein the first logic circuits comprise peripheral circuits, and the second logic circuits comprise page buffer circuits.

8. The semiconductor device according to claim 6, wherein the first operating voltage comprises a power supply voltage, and the second operating voltage comprises a core voltage.

9. The semiconductor device according to claim 6,
wherein the metal layers comprise first to third metal layers which are disposed at vertically different positions, and
wherein each of the first and second power lines has a structure in which metal lines disposed in the third metal layer and metal lines disposed in the second metal layer are electrically coupled through vertical vias.

10. The semiconductor device according to claim 9, wherein metal lines constituting the first and second power lines are disposed in the second metal layer in the first and third regions, and are disposed in the third metal layer in the second and fourth regions.

11. The semiconductor device according to claim 10, wherein the first and second power straps are disposed in the third metal layer in the first and third regions, and are disposed in the second metal layer in the second and fourth regions.

12. The semiconductor device according to claim 6, wherein the first power straps are coupled to the first power lines in the first to third regions.

13. The semiconductor device according to claim 6, wherein the second power straps are coupled to the second power lines in the second to fourth regions.

14. The semiconductor device according to claim 6, further comprising:
a plurality of third power lines extending from the first region to the fourth region in the first direction, and configured to transmit a third operating voltage to the first logic circuits and the second logic circuits.

15. The semiconductor device according to claim 14, wherein the third power lines are disposed in separate lanes from the first and second power lines.

16. The semiconductor device according to claim 14, wherein the third operating voltage comprises a ground voltage.

17. The semiconductor device according to claim 14, further comprising:
   a plurality of third power straps extending in the second direction and coupled to the third power lines.

18. The semiconductor device according to claim 17, wherein the third power straps are coupled to the third power lines in the first to fourth regions.

19. The semiconductor device according to claim 17,
   wherein the metal layers further comprise a signal line which shares a lane with at least one of the first to third power lines and the first to third power straps, and
   wherein one of the first to third power lines and the first to third power straps which shares the lane with the signal line has a reduced width in a section where it overlaps with the signal line.

20. The semiconductor device according to claim 6,
   wherein the first power lines each have a width of the same size as a width of each lane in the first region,
   wherein the second power lines each have a width of the same size as the width of each lane in the fourth region, and
   wherein the first and second power lines each have a width of a size smaller than the width of each lane in the second and third regions.

* * * * *